(12) United States Patent
Huang et al.

(10) Patent No.: US 12,173,858 B2
(45) Date of Patent: Dec. 24, 2024

(54) LIGHT EMITTING DIODE ASSEMBLY AND PLANT LIGHTING FIXTURE

(71) Applicant: HANGZHOU HPWINNER OPTO CORPORATION, Hangzhou (CN)

(72) Inventors: Jianming Huang, Hangzhou (CN); Kai Chen, Hangzhou (CN)

(73) Assignee: Hangzhou Hpwinner Opto Corporation, Hangzhou (CN)

(*) Notice: Subject to any disclaimer, the term of this patent is extended or adjusted under 35 U.S.C. 154(b) by 0 days.

(21) Appl. No.: 18/125,721

(22) Filed: Mar. 23, 2023

(65) Prior Publication Data
US 2024/0027038 A1  Jan. 25, 2024

(30) Foreign Application Priority Data

Jul. 21, 2022 (CN) .......................... 202210856381.8
Jul. 21, 2022 (CN) .......................... 202221883630.4
Jul. 21, 2022 (CN) .......................... 202221920889.1

(51) Int. Cl.
*F21S 4/28* (2016.01)
*F21V 5/00* (2018.01)
*F21V 19/00* (2006.01)
*F21V 31/00* (2006.01)

(52) U.S. Cl.
CPC ................ *F21S 4/28* (2016.01); *F21V 5/007* (2013.01); *F21V 19/0045* (2013.01); *F21V 31/005* (2013.01)

(58) Field of Classification Search
CPC .... F21V 5/007; F21V 19/0045; F21V 31/005; F21S 4/28
See application file for complete search history.

(56) References Cited

U.S. PATENT DOCUMENTS

| | | | |
|---|---|---|---|
| 8,378,375 B2 * | 2/2013 | Lee ...................... | H01L 25/0753 257/89 |
| 8,575,645 B2 * | 11/2013 | Hwu .................... | H01L 25/0753 257/E33.058 |
| 8,587,010 B2 * | 11/2013 | Yoo ........................ | H01L 24/97 257/98 |
| 8,969,908 B2 * | 3/2015 | Negley ................. | H01L 33/486 257/E33.059 |
| 9,373,606 B2 * | 6/2016 | Helbing .................. | H01L 33/56 |
| 9,379,295 B2 * | 6/2016 | Kobayakawa .......... | H01L 33/52 |
| 10,020,430 B2 * | 7/2018 | Nguyen ................ | H01L 33/504 |
| 10,510,936 B2 * | 12/2019 | Yun ........................ | H01L 33/60 |
| 10,989,372 B2 * | 4/2021 | Meir ....................... | F21V 21/02 |

(Continued)

*Primary Examiner* — Arman B Fallahkhair
(74) *Attorney, Agent, or Firm* — Zhu Lehnhoff LLP

(57) ABSTRACT

An LED assembly includes a substrate, an LED module mounted on the substrate, and a lens plate disposed on the substrate. The lens plate has a lens portion disposed atop the LED module and defining a space between an inner surface of the lens portion and the LED module. A filler material having a refractive index greater than air fills the space between the LED module and the inner surface of the lens portion. The LED module includes a chip holder mounted on the substrate, a red LED chip mounted on the chip holder, and an optical encapsulant covering the top surface of the LED chip. The LED module is a plastic leaded chip carrier package. The refractive index of the filler material preferably differs from the refractive index of the optical encapsulant by at most ±0.3.

29 Claims, 15 Drawing Sheets

(56) References Cited

U.S. PATENT DOCUMENTS

| | | | | |
|---|---|---|---|---|
| 11,473,751 B2* | 10/2022 | Ueno | ............... | F21S 45/48 |
| 11,677,059 B2* | 6/2023 | Yun | ............... | H01L 33/486 |
| | | | | 257/98 |
| 2006/0245188 A1* | 11/2006 | Takenaka | ............ | H01L 25/0753 |
| | | | | 362/267 |
| 2007/0205425 A1* | 9/2007 | Harada | ............. | H01L 33/58 |
| | | | | 257/E33.059 |
| 2008/0169480 A1* | 7/2008 | Weng | ............. | H01L 33/486 |
| | | | | 257/E33.059 |
| 2009/0207111 A1* | 8/2009 | Wang | .............. | G09F 9/33 |
| | | | | 345/83 |

* cited by examiner

LIGHT EMITTING DIODE ASSEMBLY AND PLANT LIGHTING FIXTURE

REFERENCE TO RELATED APPLICATIONS

The present application claims the priorities of Chinese Patent Applications CN 202221920889.1 filed on Jul. 21, 2022, CN 202221883630.4 filed on Jul. 21, 2022, and CN 202210856381.8 filed on Jul. 21, 2022, the disclosures of which applications are incorporated herein by reference.

BACKGROUND OF THE INVENTION

This invention relates to a light emitting diode assembly and a plant lighting fixture for promoting the growth of plants.

Light emitting diodes (referred to below as LEDs) are widely used in lighting fixtures for promoting the growth of plants (referred to below as plant lighting fixtures). Red LEDs (LEDs which emit red light) are particularly suitable for use in plant lighting fixtures in order to promote rapid rooting and improve the quality of seedlings.

At present, red LEDs for plant lighting fixtures are generally packaged into modules by the ceramic packing method. However, ceramic LED packages have a high manufacturing cost. The PLCC (plastic leaded chip carrier) packaging method can also be used to manufacture red LEDs for plant lighting fixtures. PLCC packaging for LEDs has a significantly lower cost than ceramic packaging, but red PLCC LED packages have low light transmittance compared with red ceramic LED packages, and they are unable to meet the requirements of red light plant lighting. Accordingly, there is a need for a PLCC LED package for red light which has excellent light transmittance and is suitable for use in plant lighting.

SUMMARY OF THE INVENTION

The present invention provides an LED assembly which generates red light and is suitable for use in plant lighting.

The present invention also provides a plant lighting fixture including at least one LED assembly according to the present invention.

The present invention further provides a method of promoting plant growth using an LED assembly according to the present invention.

The present invention additionally provides an LED module which is suitable for use in an LED assembly and which contains a plurality of red LED chips.

According to one form of the present invention, an LED assembly comprises a substrate, an LED module mounted on the substrate, a lens plate disposed on the substrate and having at least one lens portion disposed atop the LED module and defining a space between an inner surface of the lens portion and the LED module, and a filler material which has a refractive index greater than that of air and which fills the space between the LED module and the inner surface of the lens portion. The LED module comprises a support member in the form of a chip holder mounted on the substrate, an LED chip for emitting red light mounted on the chip holder, and an optical encapsulant covering at least the top surface of the LED chip. The optical encapsulant preferably has a planar top surface. The LED module is a plastic leaded chip carrier package. The difference between the refractive index of the filler material and the refractive index of the optical encapsulant is preferably at most ±0.3.

The LED assembly may include a single LED module, or it may include a plurality of LED modules mounted on the substrate.

Each LED module may contain one or more red LED chips. When an LED module according to the present invention contains a plurality of red LED chips, the chip holder preferably includes at least one partition for dividing the interior of the chip holder into a plurality of compartments, with each of the red LED chips disposed in a different one of the compartments. The one or more partitions can block light from an LED chip in one compartment from impacting another LED chip disposed in an adjoining compartment.

An LED module according to the present invention containing a plurality of red LED chips may be employed in an LED assembly according to the present invention including a filler material between the LED module and a lens. Alternatively, it may be employed in an LED assembly which does not employ a filler material atop the LED module.

According to another form of the present invention, a plant lighting fixture comprises a mounting frame and at least one LED assembly according to the present invention mounted on the mounting frame.

According to still another form of the present invention, a method of promoting plant growth comprises irradiating a plant with red light using an LED assembly according to the present invention.

In this description, an individual light emitting element in the form of an LED will be referred to as an LED chip. Unless otherwise indicated, the LED chip is a red LED chip, namely, an LED chip which emits red light.

The combination of an LED chip, a chip holder on which the LED chip is disposed and to which the LED chip is electrically connected, and an optical encapsulant disposed on the chip holder atop the LED chip will be referred to as an LED module.

The combination of a substrate such as a printed circuit board, one or more LED modules mounted on the substrate, and a lens plate disposed on the substrate atop the one or more LED modules will be referred to as an LED assembly.

A lighting device including one or more LED assemblies according to the present invention for use in providing illumination will be referred to as a lighting fixture. A lighting fixture intended for use with plants will be referred to as a plant lighting fixture.

These and other features of the present invention will be described further below in connection with a number of embodiments along with the accompanying drawings. However, the present invention may be implemented in many different forms, and should not be construed as being limited by the below-described embodiments. In the drawings, some components are shown schematically, such as in an exaggerated manner so as to facilitate an understanding of the present invention. Therefore, the dimensions, dimensional ratios, and the like of the constituent elements may differ from the actual dimensions, dimensional ratios, etc.

DESCRIPTION OF PREFERRED EMBODIMENTS

Figure 1:
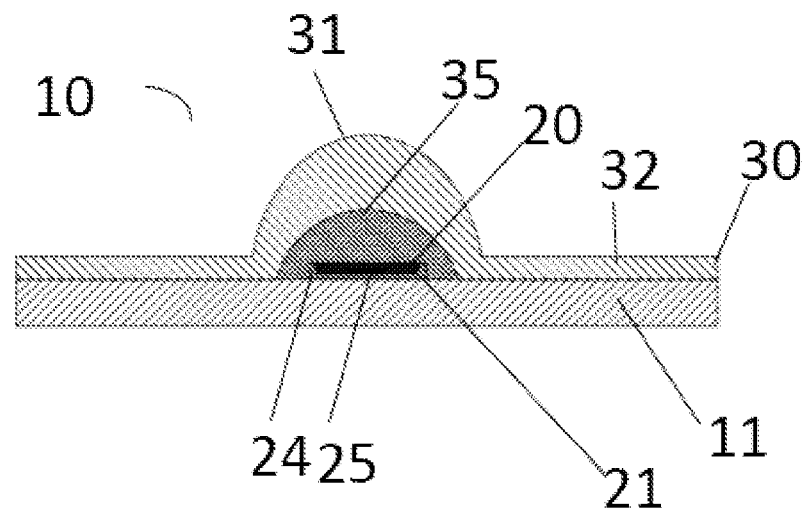
FIG. 1 is a schematic cross-sectional elevation of an embodiment of an LED assembly according to the present invention.
Figure 2:
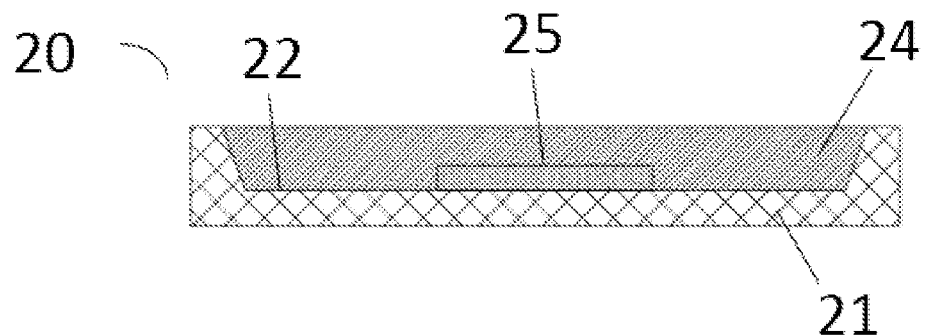
FIG. 2 is an enlarged schematic cross-sectional elevation of the LED module in the LED assembly shown in FIG. 1.

FIGS. 1 and 2 illustrate a first embodiment of an LED assembly 10 according to the present invention. FIG. 1 is a schematic cross-sectional elevation of the entire LED assembly 10, and FIG. 2 is an enlarged schematic cross-sectional elevation of the LED module 20 of the LED assembly 10 shown in FIG. 1. As shown in these figures, in this embodiment, an LED assembly 10 comprises a substrate 11, an LED module 20 mounted atop the substrate 11, and a lens plate 30 disposed atop the substrate 11 and covering the LED module 20. FIG. 1 shows only a single LED module 20, but the LED assembly 10 may include a plurality of LED modules 20 mounted on the substrate 11 beneath the lens plate 30.

As shown in FIG. 2, the LED module 20 includes a tray-shaped support member referred to below as a chip holder 21, a red LED (referred to below as an LED chip 25) mounted on the chip holder 21, and an optical encapsulant 26 which covers at least the top surface of the LED chip 25. The illustrated LED module 20 includes a single LED chip 25, but as described below, it may instead include a plurality of LED chips 25.

The LED module 20 is preferably a PLCC (plastic leaded chip carrier) package. A PLCC package is superior to a ceramic package with respect to cost, thinness, ease of manufacture, and suitability for automated production.

As shown in FIG. 1, a filler material 35 covers the LED module 20 and completely fills the space between the LED module 20 and the inner surface of the lens plate 30. A red light LED module in the form of a PLCC package typically has a lower light efficiency than a red light LED module employing a ceramic package. However, the presence of the filler material 35 enables a red light LED assembly according to the present invention to have a greatly increased light efficiency while benefitting from the advantages of a PLCC package.

In this embodiment, the LED chip 25 preferably has a vertical package structure in which the positive and negative electrodes of the LED chip 25 are on opposite sides of the LED chip 25, namely, on the top and bottom sides. An LED chip with a horizontal structure in which the p and n electrodes are on the same side of the LED chip is prone to current congestion. Due to the poor thermal conductivity of a sapphire substrate commonly used with a horizontal chip structure, heat loss is seriously impaired. During long-term use, high temperatures caused by poor heat dissipation affect the performance and transmittance of an optical encapsulant. In addition, poor heat dissipation adversely affects the performance of an LED chip.

Compared with a horizontal package structure, a vertical package structure uses a substrate made of a material with high thermal conductivity (Si, Ge, and Cu substrates) instead of a sapphire substrate, which greatly improves heat dissipation efficiency. In a vertical package structure, the two electrodes of the LED chip are on opposite sides of the epitaxial layer of the LED, so almost all current flows vertically through the epitaxial layer, and the current flowing laterally through the LED chip is very small, thereby avoiding the occurrence of locally high temperatures. As a result, a vertical package structure has better heat dissipation than a horizontal package structure, resulting in improved light efficiency and increasing the life span of an LED chip.

In each of the embodiments of an LED module according to the present invention, an optical encapsulant (such as the optical encapsulant 26 shown in FIG. 2) can be any optical encapsulant which can protect an LED chip against moisture, has good transmittance with respect to light in the wavelengths emitted by the LED chip, and is chemically and physically compatible with other components of the LED module. For example, the optical encapsulant can be selected from a wide variety of commercially-available optical encapsulants for LED modules. Optical encapsulants are typically silicone-based adhesives, and such optical encapsulants are suitable for use in the present invention, but an optical encapsulant used in the present invention is not restricted to any particular composition.

As shown in FIG. 2, in the present embodiment the chip holder 21 has a recess 22 on the side of the chip holder 21 facing the lens plate 30. The LED chip 25 is disposed inside the recess facing the lens plate 30, and the optical encapsulant 26 is disposed within the recess 22 atop the LED chip 25.

As shown in FIG. 2, the optical encapsulant 26 may extend to the bottom inner surface of the recess 22 of the chip holder 21 and cover the entire top surface as well as the entirety of the side surfaces of the LED chip 25. Alternatively, as described below, an optically reflective layer for increasing the amount of light reflected from the recess 22 may be provided inside the recess 22 underneath the optical encapsulant 26, with the optically reflective layer covering a portion of the side surfaces of the LED chip 25, and with the optical encapsulant 26 covering the entire top surface and the remainder of the side surfaces of the LED chip 25. The top surface of the optical encapsulant 26 (the surface which faces the interior surface of the lens plate 30) is preferably planar. In the present embodiment, the top surface of the optical encapsulant 26 extends to the upper end of the recess 22 of the chip holder 21 and is flush with the top surface of the chip holder 21.

The side walls of the recess 22 of the chip holder 21 are preferably sloped with respect to the bottom surface of the recess 22 by less than 90 degrees so that light emitted by the LED chip 25 which is incident upon the side walls of the recess 22 will be reflected by the side walls towards the open upper end of the recess 22 in a direction having a component normal to the bottom surface of the recess 22. The angle of slope of the side walls of the recess 22 is preferably an obtuse angle.

One or both of the bottom inner surface and the side walls of the recess 22 preferably has a reflective coating for reflecting light incident upon it from the LED chip 25. The coating may be one having high reflectivity, such as a silver or aluminum layer providing a mirror-like surface, or it may be a coating providing diffuse reflection of light. As another alternative, the coating may be one providing both a mirror-like surface and diffuse reflection of light. Preferably the coating produces diffuse reflection, which improves the luminous flux. Various types of coatings which produce diffuse reflection are possible. For example, the coating can be a paint which produces diffuse reflection. Alternatively, it can be a coating of the same type of metal, such as silver or aluminum, which can be used to form a mirror-like surface but which has its surface roughened to produce diffuse reflection. Light from the LED chip 25 which travels laterally from the LED chip 25 can be reflected from the coating on the side walls of the recess 22 and directed towards the lens plate 30 to become effective light, resulting in a greatly improved luminous flux.

The wavelength of light generated by the LED chip 25 can be selected in accordance with the intended use of the LED assembly 10. It has been found that red light with a wavelength of 655-665 nm is particularly suitable for promoting plant growth.

In the present embodiment, the lens plate 30 includes one or more lens portions 31 each of which covers a corresponding LED module 20 and transmits light from the LED chip 25 to outside of the LED assembly 10 in a desired pattern. The lens plate 30 further includes a planar peripheral portion 32 which surrounds the lens portions 31 and covers the remainder of the substrate 11. The peripheral portion 32 of the lens plate 30 can be secured to the substrate 11 in any convenient manner, such as by a snap fit, screws, or the like. FIG. 1 shows only a single lens portion 31, but the lens plate 30 will frequently have a plurality of lens portions 31, depending upon the number of LED modules 20 in the LED assembly 10.

Each lens portion 31 of the lens plate 30 includes a cavity which extends down to the top surface of the substrate 11 and covers the LED module 20 from above. The portion of the interior of the cavity not occupied by the LED module 20 is completely filled with the filler material 35.

In the present embodiment, the inner surface of the cavity of the lens portion 31 is curved three dimensionally and has approximately the shape of a hemisphere. However, the inner surface of the cavity may have planar regions. For example, the inner surface may have a rectangular shape as viewed in a vertical cross section. Alternatively, the inner surface may have both planar and curved regions. In addition, a curved region of the lens portion 31 need not be hemispherical or three-dimensionally curved. The shape of the inner surface of the cavity can be selected based on the desired optical properties of the lens plate 30.

A lens plate used in an LED assembly according to the present invention can be formed of any material having the desired optical properties. For example, it can be formed from any of the materials commonly used for lenses of LEDs, such as polycarbonate (PC), polymethyl methacrylate (PMMA), and moldable optical silicones.

As described below, the filler material 35 acts to adjust the angle of refraction and therefore the path of light emitted by the LED chip 25. In the present embodiment, the filler material 35 has a refractive index in the range of 1.3-1.7, but the refractive index is not restricted to this range and can be selected based on the specific situation and the optical properties of the lens plate 30. The refractive index of the filler material is preferably within ±0.3 of the refractive index of the optical encapsulant 26 which covers the LED chip 25 within the chip holder 21 to reduce total internal reflection of light at the interface between the top surface of the optical encapsulant 26 and the filler material 35. The closer the refractive index of the optical encapsulant 26 is to the refractive index of the filler material 35, the less total internal reflection occurs. As long as the refractive index of the filler material 35 is higher than that of air, total internal reflection can be reduced compared to if the optical encapsulant 26 is in contact with air at its upper surface.

A filler material used in an LED assembly according to the present invention can be selected from materials having good transmittance with respect to red light emitted by a red LED chip, a desired refractive index, the ability to fill the space between an LED module and the inner surface of the lens portion 31 of a lens plate 30 so as to substantially completely exclude air from the space, and physical and chemical compatibility with the other components of the LED assembly. In the present embodiment, the filler material 35 comprises a silicone gel, although other materials having a suitable refractive index can be used, such as various colloids.

The substrate 11 is not restricted to any particular material but is typically a printed circuit board to which the LED module 20 is electrically connected.

The refractive indices of the various components of the LED assembly are not limited. By way of example, in the present embodiment, the LED chip 25 is made from a material having a refractive index of 2.9, the optical encapsulant 26 has a refractive index of 1.528, the filler material 35 has a refractive index of 1.42, and the lens plate 30 has a refractive index of 1.59.

Next, the effect of an optical encapsulant and a filler material on the luminous flux of an LED module will be analyzed. In this analysis, the upper surface of the LED chip 25 is assumed to be a luminous surface, the light intensity distribution is assumed to be a Lambert-type distribution, and the peak light intensity of the LED chip 25 is assumed to be $I_0$.

Figure 3:
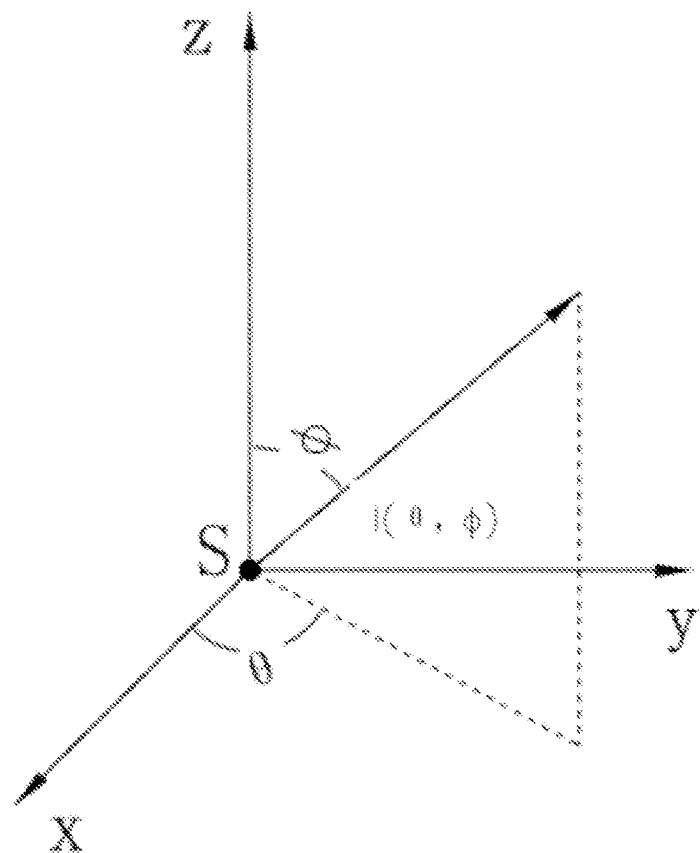
FIG. 3 is a schematic diagram illustrating the coordinates used in calculating the luminous flux of an LED assembly according to the present invention.

FIG. 3 illustrates the coordinates and angles used when calculating the flux of a light source having a Lambert-type light intensity distribution. In this figure, S is the light source, $\varphi$ is the angle between the incident light and the z-axis ($0 \leq \varphi \leq 90$ degrees), and $\theta$ is the angle between a projection of the incident light onto the x-y plane and the x-axis ($0 \leq \theta \leq 360$ degrees). The luminous flux at the source $\Phi_{source}$ is calculated by the following equations.

$$\Phi_{source} = \int I(\theta,\varphi) d\Omega \tag{1}$$

wherein $$I(\theta,\varphi) = I_0 \cdot \cos(\varphi) \tag{2}$$

and $$d\Omega = r d\varphi \cdot r \sin \varphi d\theta / r^2 = \sin \varphi d\varphi d\theta \tag{3}$$

Substituting Equations (2) and (3) into Equation (1) gives the following equation.

$$\Phi_{source} = \int_0^{2\pi} \int_0^{0.5\pi} I_0 \cos \varphi \sin \varphi d\varphi d\theta \tag{4}$$

Based on the above formula for the luminous flux at the source $\Phi_{source}$, the luminous flux of the starting light component is calculated. The effects of the filler material and the lens can be added to give the total luminous flux.

1. Luminous Flux of the LED Module

Figure 4:
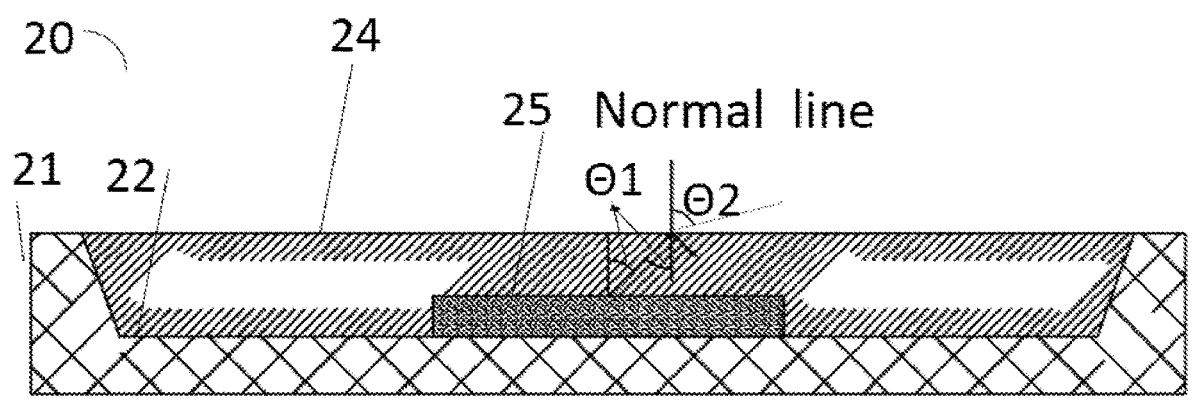
FIG. 4 is an enlarged schematic cross-sectional elevation of the LED module of FIG. 2 illustrating how light emitted from the LED module is refracted when it enters air.
Figure 5:
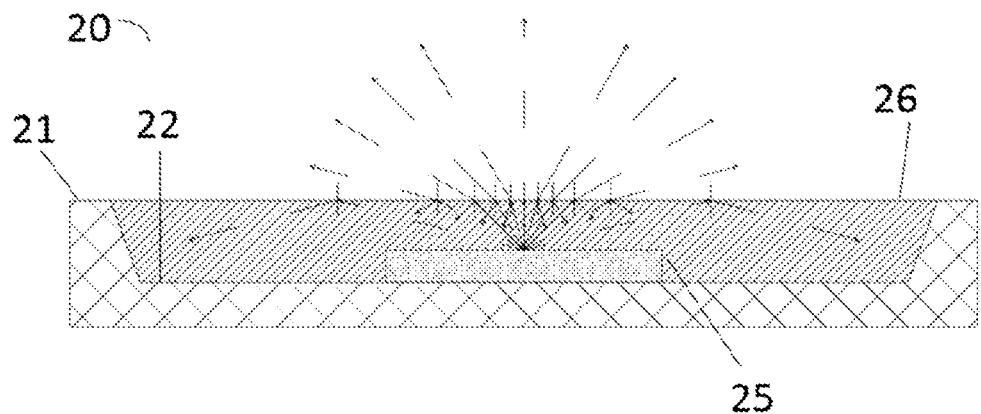
FIG. 5 is an enlarged schematic cross-sectional elevation similar to FIG. 4 illustrating how a portion of light emitted from the LED module is internally reflected and a portion is discharged from the LED module of FIG. 2 when the upper surface of the LED module is in contact with air.

FIGS. 4 and 5 schematically illustrate the pathways of light emitted from the LED chip 25 when the upper surface of the optical encapsulant 26 is in contact with air. When light emitted from the upper surface of the LED chip 25 reaches the interface between the optical encapsulant 26 and air, part of the incident light is refracted into air, and part of the light is reflected back into the optical encapsulant 26.

Because the refractive index n of the optical encapsulant 26 is greater than the refractive index of air, total internal reflection of the incident light occurs when the angle of incidence $\theta 1$ exceeds a critical angle $\theta c1 = \arcsin$ (n of air/n of the optical encapsulant) = 0.70241 radians. When the angle of incidence $\theta 1$ is less than the critical angle $\theta c1$, part of the incident light is refracted into air with an angle of refraction $\theta 2$ and becomes effective light, while another part of the incident light is reflected back into the optical encapsulant 26. The internally reflected portion of the incident light is largely wasted. Therefore, the following calculation of the amount of effective light will ignore the internally reflected light.

When the angle of incidence $\theta 1$ is in the range from 0 to the critical angle $\theta c1$, the effective portion of the luminous flux can be calculated from the following equation.

$$\Phi_1 = \int_0^{2\pi} \int_0^{\theta c1} I_0 \cos \varphi (1-\rho_n) \sin \varphi d\varphi d\theta \tag{5}$$

In Equation (5), $\rho n$ is the reflectance of natural light, which is defined by the following equations in which $\rho S$ is the reflectance of the wave component S perpendicular to the incident plane, $\rho n$ is the component of the wave p parallel to the incident plane, $\theta 1$ is the angle of incidence, $\theta 2$ is the angle of refraction, n1 is the refractive index of the medium on the incident light side, and n2 is the refractive index of the medium on the exit side.

$$\rho_n = (\rho_s + \rho_p)/2 \tag{6}$$

$$\rho_s = \sin^2(\theta 1 - \theta 2)/\sin^2(\theta 1 + \theta 2) \tag{7}$$

$$\rho_p = \tan^2(\theta 1 - \theta 2)/\tan^2(\theta 1 + \theta 2) \tag{8}$$

$$n_1 \cdot \sin(\theta 1) = n_2 \cdot \sin(\theta 2) \tag{9}$$

Substituting Equations (6)-(9) into Equation (5) and integrating gives the following equation for the luminous flux of the LED module.

$$\Phi_1 = 1.21 \cdot I_0 \tag{10}$$

2. Luminous Flux after the Addition of a Lens without a Filler Material

It is relatively simple to calculate the luminous flux of the combination of an LED module covered by a lens without the presence of a filler material. When light emitted from the LED module passes through a lens, reflection loss occurs at the interface between air and the lens on the inner surface of the lens, absorption loss occurs as light passes through the lens, and reflection loss occurs at the interface between the lens and air on the outer surface of the lens.

The reflectance at the two interfaces is given by the following equation.

$$\rho_n = ((n-1)/(n+1))^2 \tag{11}$$

wherein n is the relative refractive index, which is defined as n=n2/n1. If n=1.529, then $$\rho_n = ((1.529-1)/(1.529+1))^2 = 4.4\% \tag{12}$$

When the lens is a polycarbonate lens, its absorption coefficient is 4%/cm, and if it has a thickness of 0.319 cm, the percent absorption is 0.04%/cm×0.319 cm=1.3%.

When light exits from the lens into air, the reflectance is give by the following equation.

$$\rho_n = ((0.654-1)/(0.645+1))2 = 4.4\% \tag{13}$$

In summary, the luminous flux when a lens is added to the LED module without the use of a filler material is given by the following equation.

$$\Phi_4 = \Phi_1 \times 95.6\% \times 98.7\% \times 95.6\% = 0.9 \Phi_1 \tag{14}$$

3. Luminous Flux with a Lens and Filler Material

Figure 6:
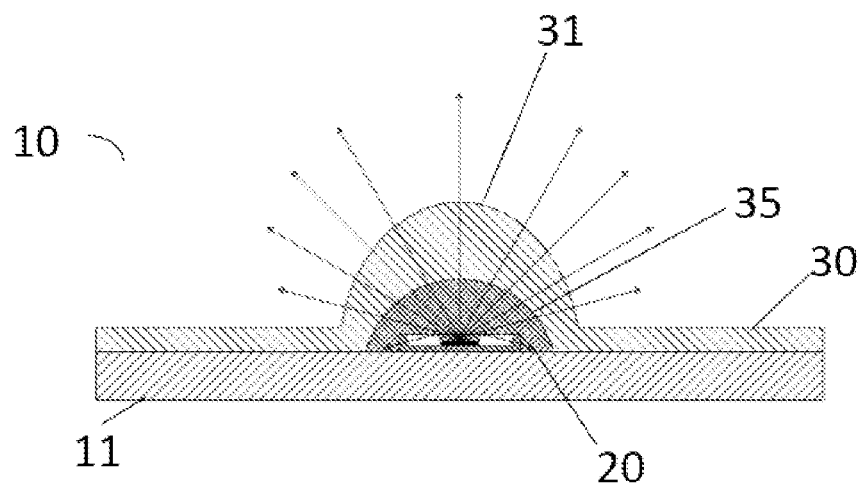
FIG. 6 is an enlarged cross-sectional elevation of the LED assembly shown in FIG. 1, illustrating the effect of the filler material and the lens plate on the pathways of light emitted from the LED module.

As shown in FIG. 6, when light emitted from the upper surface of an LED chip in an LED module 20 is incident upon the interface between the optical encapsulant 26 and the filler material 35, part of the incident light is refracted by the filler material 35, and part of the incident light is reflected back into the LED module 20. The method for calculating the effective amount of light will be the same as when air is present above the optical encapsulant except that the critical angle θc will be different from that situation due to the difference between the index of refraction of air and that of the filler material 35.

If the refractive index of the optical encapsulant 26 is greater than that of the filler material 35, total internal reflection will take place when the angle of incidence exceeds the critical angle. If the refractive index n1 of the optical encapsulant is 1.528 and the refractive index n2 of the filler material is 1.42, then the critical angle θc2=arcsin (n of filler material/n of optical encapsulant)=arcsin (1.42/1.528)=1.1926 radians. When the angle of incidence is less than the critical angle θc2, a portion of the incident light is refracted and becomes effective light, and another part is internally reflected back into the optical encapsulant 26. Most of the internally reflected light is wasted. Therefore, for simplicity, the following calculations will ignore the internally reflected portion of the incident light and treat it as wasted.

When the angle of incidence is in the range of 0 to θc2 degrees, the effective component of the luminous component is given by the following equation.

$$\Phi_2 = \int_0^{2\pi}\int_0^{\theta c2} I_0 \cos\varphi(1-\rho_n)\sin\varphi d\varphi d\theta \quad (15)$$
$$= 2.6918 \times I_0$$

Light which enters the filler material 35 will pass through the interface between the filler material 35 and the inner surface of the lens and then through the interface between the outer surface of the lens and the air. Fresnel reflection loss will take place at both interfaces. Assuming that light incident upon the interfaces is nearly perpendicular to the two interfaces, the reflectance is as follows:

$\rho_1$=0.1% and $\rho_2$=5.2%, so the total internal reflection loss is 5.3%.

The following formula gives the total reflectance, wherein n is the relative refractive index=n2/n1.

$$\rho_n = ((n-1)/(n+1))^2 \quad (16)$$

It is also necessary to consider the absorption of light passing through the optical encapsulant 26, the filler material 35, and the lens. Assuming that the filler material 35 is a silicone gel having an absorption coefficient of 2.5%/cm, the lens is a polycarbonate lens with an absorption coefficient of 4%/cm, the thickness of the filler material 35 is about 0.257 cm, and the thickness of the lens is about 0.319 cm, then the total absorption is (0.025/cm×0.257 cm)+(0.04/cm×0.319 cm)=1.9%

The total of the reflection loss and absorption loss for this example comes to 7.2%.

The overall luminous flux, taking into consideration the effect of the filler material 35 and the reflection and absorption loss of the lens, is given by the following formula.

$$\Phi_3 = 2.6918 \times I_0 \times (1-0.072) = 2.50 \times I_0 \quad (17)$$

In the above calculation of $\Phi_3$, it was assumed that light from the filler material 35 which is incident upon the inner surface of the lens is normal to the inner surface of the lens. However, because the refractive index of the lens is very close to that of the filler material, variations of the incident light path from a path normal to the inner surface of the lens have a very small impact on transmittance.

Assuming that light which is reflected at the interface between the optical encapsulant 26 and the filler material 35 is wasted, the luminous flux of the LED module 20 alone is 1.21×$I_0$, while the luminous flux of the combination of the LED module 20, a lens, and a filler material 35 is 2.23×$I_0$. Thus, the addition of a lens and a filler material 35 can increase the luminous flux by 84% compared to that of the LED module 20 alone.

However, if the interior surface of the recess 22 in the chip holder 21 of the LED module 20 has a reflective coating, the overall reflectivity of the coating with respect to light reflected is 40%.

Taking the light reflected from the inner surface of the recess 22 into consideration, the total luminous flux of an LED module 20 alone becomes 1.21×$I_0$+(3.1416−1.21)(0.4×$I_0$)=1.98×$I_0$, and the total luminous flux of the combination of an LED module 20, a lens, and a filler material 35 becomes 2.50×$I_0$+(3.1416−2.6918)(0.4×0.928×$I_0$)=2.67×$I_0$.

Thus, taking the increase in effective light due to light reflected from the inner surface of the recess 22 of the chip holder 21 into consideration, the combination of an LED module 20, a lens, and a filler material 35 increases the luminous flux by 34.8% compared to that of an LED module 20 alone.

When light emitted by an LED chip 25 having an intensity of 3.14×$I_0$ passes through the interface between the optical encapsulant 26 and air for the first time, only 1.21×$I_0$ of the light is refracted, which is 38.5%. More than 60% of the incident light is reflected back into the LED module 20.

When a lens and a filler material 35 are added to an LED module 20, the light emitted by the light source with an intensity of 3.14×$I_0$ is refracted when it first passes through the interface between the optical encapsulant 26 and the filler material 35. Based on Equation (15), the intensity of the light refracted into the filler material is 2.69×$I_0$. Accordingly, 2.69/3.14=85.7% of the incident light is refracted into the filler material 35. Therefore, the transmittance of light is greatly improved compared to that of an LED module 20 alone. This is mainly because the refractive index of the filler material 35 is much higher than that of air and the refractive index of the optical encapsulant 26 is close to 1.528. The higher refractive index of the filler material 35 compared to that of air increases the critical angle and greatly reduces total internal reflection (and can also reduce Fresnel reflection, but it mainly reduces total internal reflection). If the refractive index of the filler material 35 is equal to or greater than that of the optical encapsulant 26, total internal reflection is totally eliminated, further increasing transmittance.

In order to demonstrate the effects of a lens combined with a filler material, the luminous flux of three different types of LED modules was measured. Each LED module included 18 identical red LED chips mounted on a printed circuit board. Each LED chip was a 5050-size chip having a thickness of 55 mils=0.055 inches. The first type of LED module was not equipped with a lens or filler material. The second type of LED module was equipped with a lens but no filler material. The third type of LED module was equipped with both a lens and a filler material inside the lens. Each specimen was tested at seven different power levels. The power P, the luminous flux Φ, the photosynthetic photon flux PPF, and the photosynthetic photon efficiency PPE were measured for each run. The results of measurement are shown in the following Tables 1-3 for the first type, the second type, and the third type of LED module, respectively.

TABLE 1

LED module with no lens and no filler material

| Run number | P (W) | Φ (lm) | PPF (mol/s) | PPE (ppf/W) |
|---|---|---|---|---|
| 1 | 8.17 | 276.05 | 24.135 | 2.95 |
| 2 | 10.3 | 340.14 | 29.948 | 2.91 |
| 3 | 12.06 | 384.8 | 34.459 | 2.86 |
| 4 | 13.89 | 435.34 | 39.2 | 2.82 |
| 5 | 16.3 | 495.79 | 45.028 | 2.76 |
| 6 | 18.23 | 545.6 | 49.843 | 2.73 |
| 7 | 20.21 | 595.3 | 54.42 | 2.69 |

TABLE 2

LED module with polycarbonate lens but no filler material

| Run number | P (W) | Φ (lm) | PPF (mol/s) | PPE (ppf/W) |
|---|---|---|---|---|
| 1 | 8.163 | 253.996 | 22.20 | 2.71 |
| 2 | 10.28 | 312.9288 | 27.55 | 2.68 |
| 3 | 12.11 | 354.016 | 31.70 | 2.63 |
| 4 | 13.85 | 400.5128 | 36.06 | 2.59 |
| 5 | 16.24 | 456.1268 | 41.43 | 2.54 |
| 6 | 18.26 | 501.952 | 45.86 | 2.51 |
| 7 | 20.17 | 547.676 | 50.07 | 2.47 |

TABLE 3

LED module with polycarbonate lens and filler material

| Run number | P (W) | Φ (lm) | PPF (mol/s) | PPE (ppf/W) |
|---|---|---|---|---|
| 1 | 8.161 | 352.5 | 29.472 | 3.61 |
| 2 | 10.29 | 436.04 | 36.637 | 3.56 |
| 3 | 12.06 | 498.92 | 42.265 | 3.5 |
| 4 | 13.89 | 565.14 | 48.159 | 3.47 |
| 5 | 16.29 | 644.87 | 55.347 | 3.4 |
| 6 | 18.22 | 711.29 | 61.267 | 3.36 |
| 7 | 20.19 | 773.84 | 66.865 | 3.31 |

The data in the above tables shows that the values of Φ, PPF, and PPE were greater for specimens having a lens and filler material than for specimens having a lens but no filler material, indicating an increased light efficiency.

One type of LED module which has been proposed in the past contains a red LED chip encapsulated with an optical encapsulant having a planar top surface. However, the PPE of such an LED module is low.

Another type of LED module which has been proposed in the past contains a white LED chip encapsulated with an optical encapsulant having a planar top surface and a filler material which fills the space between the optical encapsulant and the inner surface of a lens covering the LED module. However, it was found that the filler material does not significantly improve the PPE of the LED module.

Yet another type of LED module which has been proposed in the past contains a red or white LED chip encapsulated in an optical encapsulant having a dome-shaped outer surface. A filler material fills the space between the outer surface of the optical encapsulant and the inner surface of a lens which covers the LED module. In this case as well, the filler material does not result in a significant increase in the PPE of the LED module.

In light of such proposals, prior to the present invention, the common knowledge of those skilled in the art was that adding a filler material to an LED module does not provide an significant increase in the PPE. For this reason, the significant increase in the PPE of a red LED module according to the present invention which employs a filler material between an optical encapsulant and a lens as shown in above Table 3 is entirely unexpected.

Figure 7:
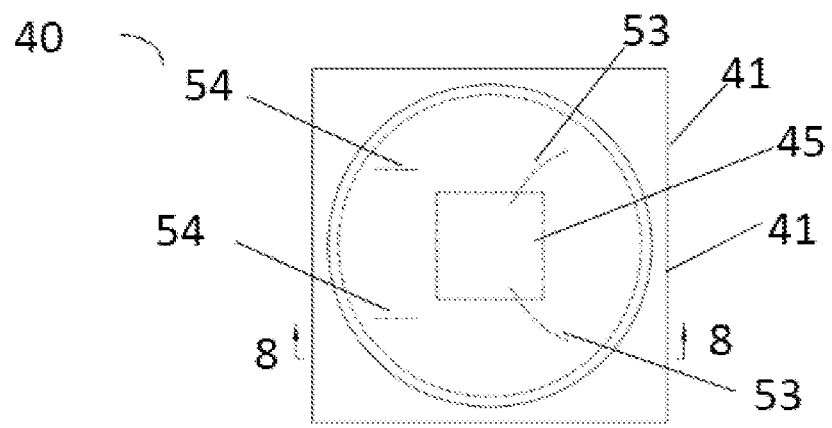
FIG. 7 is a schematic top plan view of an LED module in another embodiment of the present invention.
Figure 8:
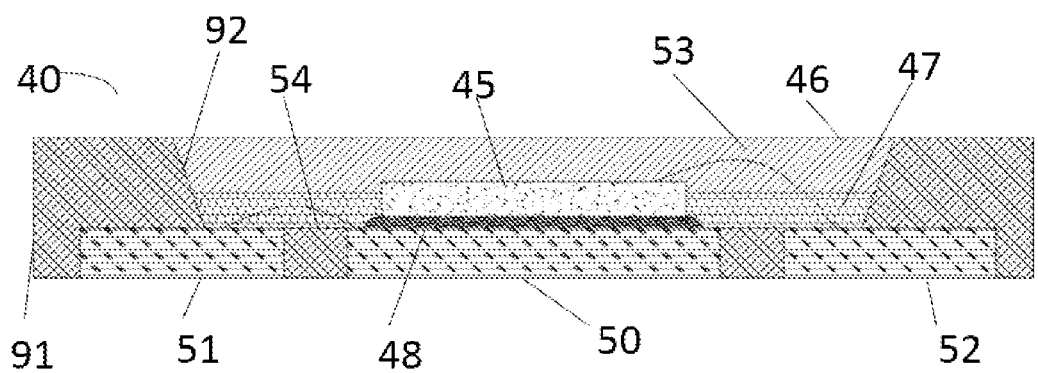
FIG. 8 is a schematic cross-sectional elevation of the LED module of FIG. 7 taken along line 8-8 of FIG. 7.
Figure 9:
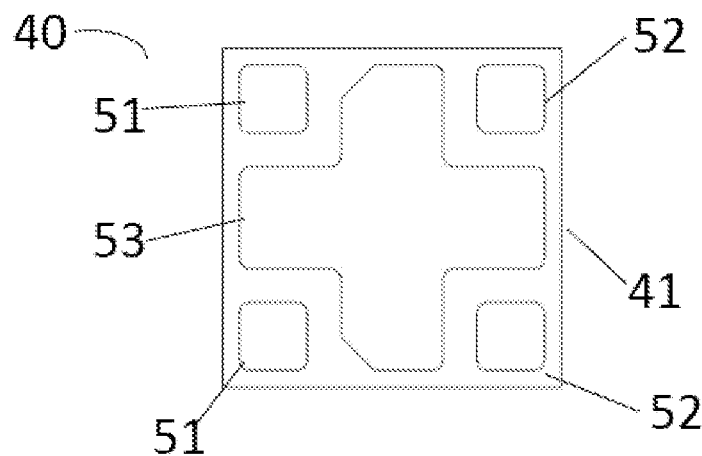
FIG. 9 is a schematic bottom plan view of the LED module shown in FIG. 8.

FIGS. 7-9 schematically illustrate an LED module 40 in another embodiment of the present invention. FIG. 7 is a top plan view of the LED module 40, FIG. 8 is a schematic cross-sectional elevation of the LED module 40 of FIG. 7 taken along line 8-8 of FIG. 7, and FIG. 9 is a bottom plan view of the LED module shown in FIG. 8.

Like the LED module 20 shown in FIG. 2, the LED module 40 of FIGS. 7-9 includes a chip holder 41 having a recess 42, an LED chip mounted 45 on the chip holder 41 within the recess 42, and an optical encapsulant 46 which covers the top surface of the LED chip 45 within the recess 42.

The side of the LED chip 45 which faces away from an unillustrated substrate on which the LED module is mounted (the upper surface of the LED chip 45 in FIG. 8) is a negative side of the LED chip 45, and the side facing the substrate (the lower surface of the LED chip 45 in FIG. 8) is the positive side of the LED chip 45. Alternatively, the side of the LED chip 45 facing away from the substrate may be the positive side, and the side of the LED chip 45 facing the substrate may be the negative side of the LED chip 45.

The chip holder 41 includes a body portion having a plurality of openings in its lower portion which communicate between the bottom outer surface of the chip holder 41 and the bottom surface of the recess 42. A plurality of plate-shaped electrically conductive metal portions 50, 51, and 52 are mounted in the openings with the top surface of each conductive metal portion exposed to the interior of the recess 42 and the bottom surface of each conductive metal portion exposed to the bottom outer surface of the chip holder 41. The conductive metal portions include positive conductive metal portions and at least one negative conductive metal portion. As shown in FIG. 9, in this embodiment, the positive conductive metal portions include a central metal conductive portion 50 (which in this example has a cruciform shape) and two additional positive conductive metal portions 51 spaced from and disposed on opposite sides of the central conductive metal portion 50, while two negative conductive metal portions 52 are spaced from and disposed on opposite sides of the central positive conductive metal portion 50. The negative side of the LED chip 45 is electrically connected to the negative conductive metal portions 52 by wires 53. The positive side of the LED chip 45 is connected to the central positive conductive metal portion 50 by an electrically-conductive die attach adhesive 48 disposed between the bottom surface of the LED chip 45 and the top surface of the central positive conductive metal portion 50. The die attach adhesive 48 is not limited to any particular type, and commercially available electrically conductive die attach adhesives commonly used with LED chips can be employed in the present invention. One non-limiting example of a suitable die attach adhesive 48 is a mixture of silver powder and an epoxy resin. The die attach adhesive 48 conducts electricity between the LED chip 45 and the central positive conductive metal portion 50, dissipates heat, and secures the LED chip 45 to the central positive conductive metal portion 50. The central positive conductive metal portion 50 is electrically connected to another of the positive conductive metal portions 51 by wires 54. The positive conductive metal portions 51 and negative conductive metal portions 52 can be electrically connected to the unillustrated substrate.

In this embodiment, the positive conductive metal portions 50 and 51 and the negative conductive metal portions 52 comprise silver-plate copper sheets, which provide a conductive and heat dissipating effect, although other materials may be used for these portions.

There are no particular restrictions on the material forming the chip holder 41. Typically it is made of an electrically insulating plastic. Some examples of suitable materials for the chip holder are PCT (poly(cyclohexylenedimethylene terephthalate)) and epoxy molding compounds (EMCs).

As shown in FIG. 8, in this embodiment, an optically reflective layer 47 for increasing reflectivity is provided beneath the optical encapsulant 46 on the bottom inner surface of the recess 42. The optically reflective layer 47 surrounds all four sides of the sides of the LED chip 45, and the LED chip 45 is at least partially embedded in the optically reflective layer 47.

The optically reflective layer 47 is not limited to a particular material, and commercially available materials used for optically reflective layers for LED modules are suitable in the present invention. An example of a suitable material is a mixture of a silicone gel adhesive with one or more of silica and titanium dioxide.

The LED module 40 shown in FIGS. 7-9 may be used in an LED assembly in the same manner as described with respect to the embodiment shown in FIGS. 1-6, and unless otherwise indicated, the various components of this embodiment may have the same structure and characteristics of the corresponding components in the embodiment of FIGS. 1-6.

Figure 10:
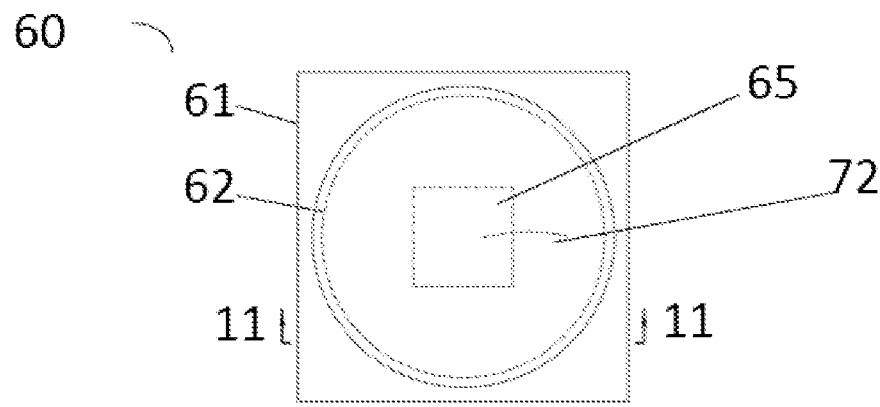
FIG. 10 is a schematic top plan view of an LED module in another embodiment of the present invention.
Figure 11:
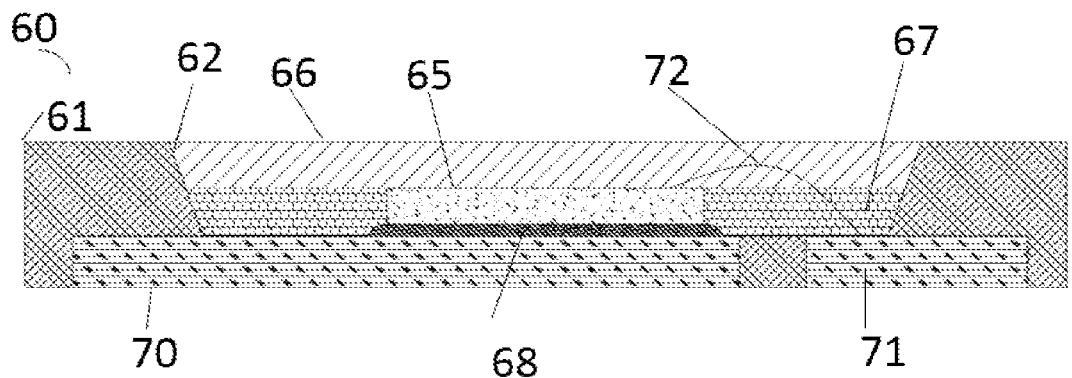
FIG. 11 is a schematic cross-sectional elevation taken along line 11-11 of FIG. 10.
Figure 12:
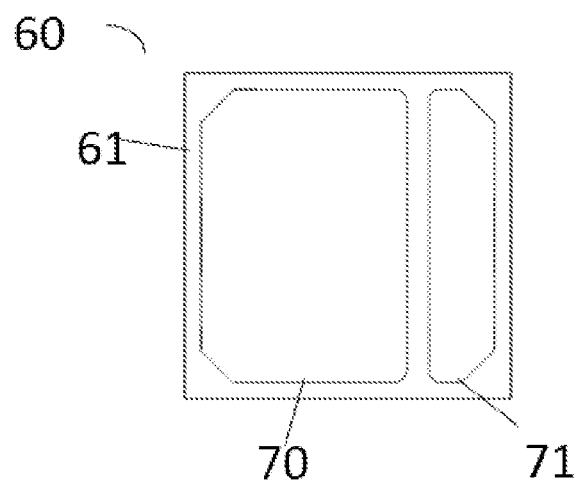
FIG. 12 is a schematic bottom plan view of the LED module shown in FIG. 11.

FIGS. 10-12 schematically illustrate an LED module 60 in another embodiment of the present invention. FIG. 10 is a top plan view of the LED module 60, FIG. 11 is a schematic cross-sectional elevation taken along line 11-11 of FIG. 10, and FIG. 12 is a bottom plan view of the LED module 60 shown in FIG. 11. As in the previous embodiments, the LED module 60 of FIGS. 10-12 includes a chip holder 61, an LED chip 65 mounted within a recess 62 of the chip holder 61, an optical encapsulant 66 which covers the top surface of the LED chip 65 within the recess 62, and an optically reflective layer 67 disposed on the bottom surface of the recess 62 beneath the optical encapsulant 66.

As best shown in FIG. 12, a positive conductive metal portion 70 and a negative conductive metal portion 71 are mounted in the bottom of the chip holder 61 where they are exposed to the bottom outer surface of the chip holder 61 and the interior of the recess 62. The negative side of the LED chip 65 (the upper side of the LED chip 65 in FIG. 11) is electrically connected to the negative conductive metal portion 71 by a wire 72, while the positive side of the LED chip 65 is electrically connected to the positive conductive metal portion 70 by a die attach adhesive 68 in the same manner as in the previous embodiment. As in the previous embodiment, the positive conductive metal portion 70 and the negative metal conductive metal portion 71 are electrically connected to an unillustrated substrate (such as a printed circuit board) on which the chip holder 65 is mounted. Unless otherwise indicated, the various components of this embodiment may have the same structure and characteristics as the corresponding components in the previous embodiments.

Figure 13:
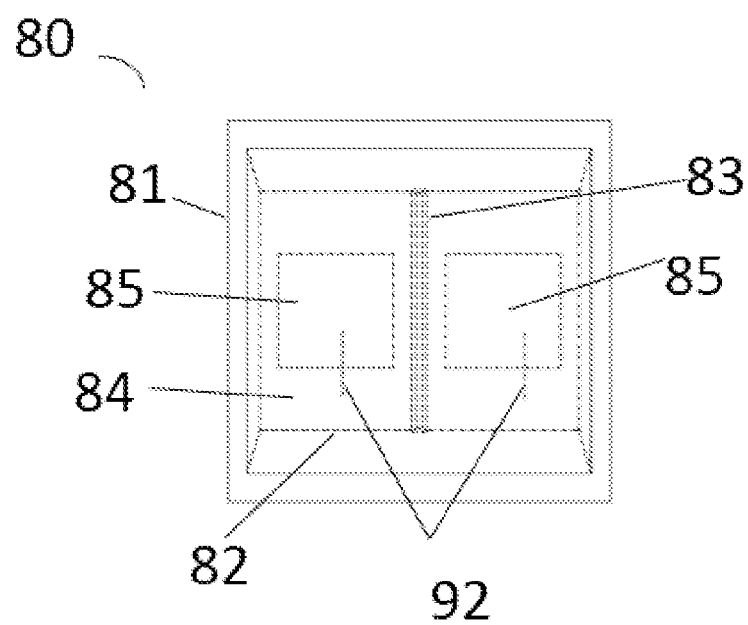
FIG. 13 is a schematic top plan view of an LED module in another embodiment of the present invention.
Figure 14:
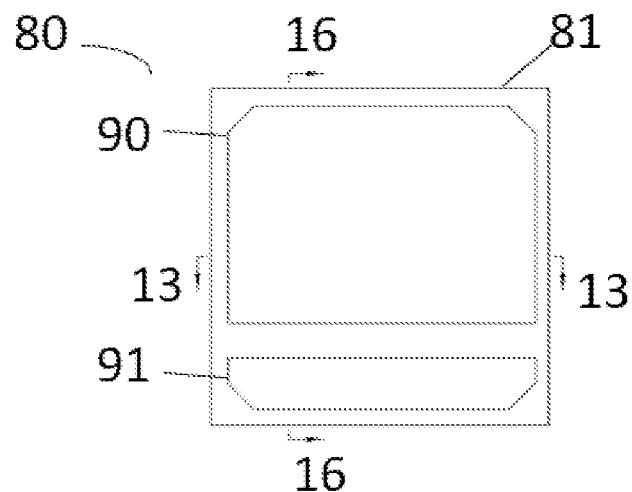
FIG. 14 is a schematic bottom plan view of the LED module of FIG. 13.
Figure 15:
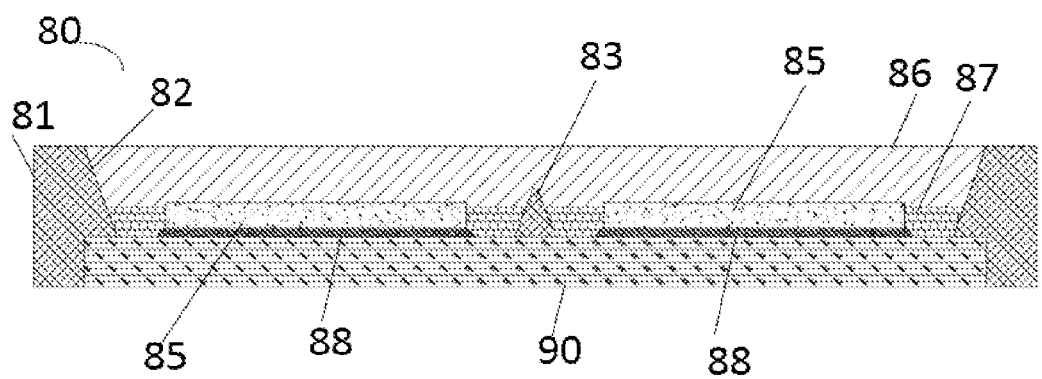
FIG. 15 is a schematic cross-sectional elevation taken along line 15-15 of FIG. 14.
Figure 16:
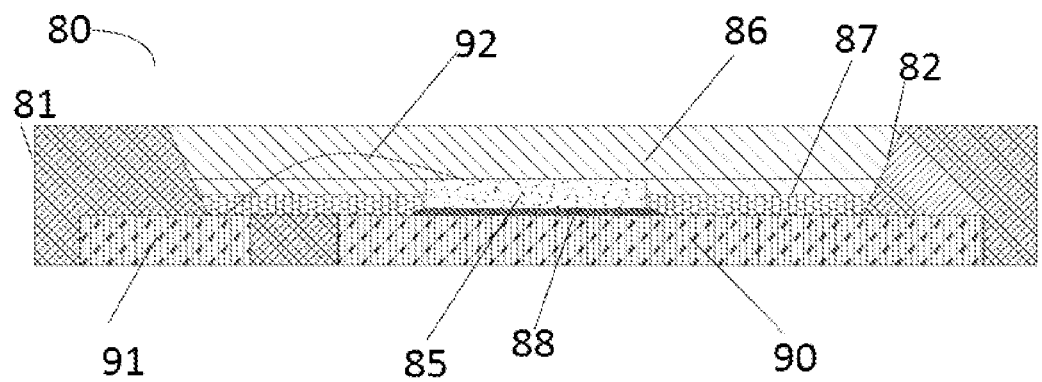
FIG. 16 is a schematic cross-sectional elevation taken along line 16-16 of FIG. 14.

FIGS. 13-16 schematically illustrate an LED module 80 in another embodiment of the present invention. FIG. 13 is a top plan view of the LED module 80, FIG. 14 is a bottom plan view of the LED module 80 of FIG. 13, FIG. 15 is a schematic cross-sectional elevation taken along line 15-15 of FIG. 14, and FIG. 16 is a schematic cross-sectional elevation taken along line 16-16 of FIG. 14. As in the previous embodiments, the LED module 80 of FIGS. 13-16 includes a chip holder 81 for mounting on a unillustrated substrate of an LED assembly. In contrast to the previous embodiments in which a single LED chip is mounted within the recess of a chip holder, in this embodiment, two LED chips 85 are mounted within a recess 82 of the chip holder 81. Although the recess 82 in this embodiment is illustrated as having a rectangular periphery as viewed in plan, the shape of the recess is not restricted, and it may have a circular periphery like the recesses of the LED modules shown in FIGS. 7 and 10, for example, or a differently shaped periphery.

Similar to the embodiment shown in FIG. 12, in this embodiment, a positive conductive metal portion 90 and a negative conductive metal portion 91 are mounted in the bottom of the chip holder 81. Each of the LED chips 85 has a downwardly facing positive side and an upwardly facing negative side. The positive sides of the LED chips 85 are secured to and electrically connected to the positive conductive metal portion 90 of the chip holder 81 by a die attach adhesive 88 in the same manner as in the embodiments of FIGS. 8 and 11. The negative sides of the LED chips 85 are each electrically connected to the negative conductive metal portion 91 by corresponding wires 92. In this manner, the two LED chips 85 are electrically connected in parallel with each other between the positive conductive metal portion 90 and the negative conductive metal portion 91.

As stated with respect to the previous embodiments, it is also possible for the upwardly facing side of each LED chip 85 to be the positive side and for the downwardly facing side of each LED chip 85 to be the negative side of the LED chip 85.

As in the preceding embodiment, an optically reflective layer 87 is formed on the bottom surface of the recess 82, and each of the LED chips 85 is at least partially embedded in the optically reflective layer 87. In addition, as in the preceding embodiment, the optically reflective layer 87 and the top surfaces of the LED chips 85 are covered by an optical encapsulant 86.

LED chips can emit light not only from their upper surfaces but also from their lateral surfaces. When multiple red LED chips are mounted in a single chip holder of an LED module with no structure separating the red LED chips from each other, light emitted from the lateral surfaces of one red LED chip can be absorbed by any adjoining red LED chips, resulting in a decrease in the PPE of the LED module. The phenomenon of absorption of light by adjoining LED chips is referred to as mutual absorption. The decrease in PPE due to mutual absorption is illustrated by the following Table 4. The PPE of LED modules containing either a single red LED chip or two red LED chips at various wattages was measured. Each LED chip was a red LED chip measuring 60 mil×60 mil.

TABLE 4

| | Total power of LED module (W) | | | | | | |
|---|---|---|---|---|---|---|---|
| | 0.44 | 0.56 | 0.67 | 0.78 | 0.89 | 1.00 | 1.11 |
| PPE (μmol/J) of LED module with one red LED chip | 4.41 | 4.35 | 4.28 | 4.23 | 4.16 | 4.12 | 4.07 |
| PPE (μmol/J) of LED module with two red LED chips | 4.23 | 4.19 | 4.15 | 4.12 | 4.09 | 4.04 | 4.02 |

In each case, the PPE of an LED module containing two red LED chips was less than the PPE of an LED module containing one red LED chip with the same total power.

Comparing the PPE (4.41 μmol/J) of the LED module containing one red LED chip having a power of 0.44 W with the PPE (4.09 μmol/J) of the LED module containing two red LED chips having a total power of 0.89 W (or 0.445 W per LED chip), it can be seen that the PPE of the LED module containing two red LED chips decreased by 7.3%.

In the field of general-purpose lighting fixtures for producing white light, it is known to package multiple LED chips in a single LED module. However, the phenomenon of a decrease in PPE due to mutual absorption of adjoining LED chips which occurs in LED modules producing red light is not a significant issue with lighting fixtures which produce white light. This is because lighting fixtures for producing white light employ blue LED chips. In such lighting fixtures, blue light generated by the blue LED chips passes through a phosphor layer within the LED module and becomes yellow light, which mixes with blue light to produce white light. Blue LED chips only weakly absorb white light and yellow light, resulting in little mutual absorption compared with red LED chips. Therefore, LED modules containing multiple red LED chips pose a unique problem not found with LED modules for generating white light.

In order to reduce or eliminate the problem of mutual absorption by adjoining red LED chips 85, in this embodiment, the two LED chips 85 are preferably separated from each other by a partition 83 which together with the side walls of the recess 82 divides the interior of the recess 82 into multiple compartments 84 and blocks light emitted from the lateral surfaces of either LED chip 85 from being absorbed by the adjoining LED chip 85. In the present embodiment, a single partition 83 extends between opposite sides of the recess 82 and divides the recess 82 into two compartments 84, each housing one of the LED chips 85. However, more than one partition 83 can be provided to divide the interior of the recess 82 into a larger number of compartments 84. By preventing or reducing the problem of mutual absorption of light by the LED chips 85, the partition 83 can improve the light generating efficiency of the LED module 80.

Like the side walls of the recess 82, the side walls of the partition 83 are preferably sloped with respect to the bottom surface of the recess 82 of the chip holder 81 by less than 90 degrees and preferably by an obtuse angle so that light from the LED chips 85 which is incident upon the side walls of the partition 83 is reflected by the side walls in a direction having a component normal to the bottom surface of the recess 82.

Similar to the bottom surface and/or the side walls of the recess 82, the sides walls of the partition 83 may have a reflective coating for reflecting light incident upon the side walls from the LED chips 85. A reflective coating may, for example, have the same composition as the reflective coating described above with respect to the reflective coating for one or both of the bottom surface and the side walls of the recess 82.

The height of the partition 83 measured from the bottom surface of the recess 82 is preferably larger than the height of the LED chips 85 in the compartments 84 adjoining the partition 83 in order to block light emitted from one of the LED chips 85 from traveling along a direct path to the LED chip 85 in the adjoining compartment 84 where the light could be absorbed. At the same time, the height of the partition 83 measured from the bottom surface of the recess 82 is preferably lower than the height of the side walls of the recess 82 so that the top of the partition 83 will not produce a bulge in the top surface of the optical encapsulant 86, which is preferably flat.

The distance between an LED chip 85 and any of the side walls of the compartment 84 in which the LED chip 85 is disposed (either a side wall of the recess 82 or a side wall of the partition 83) is preferably at least 0.3 mm to allow room for wiring of the LED chips 85.

The partition 83 may be formed separately from the body of the chip holder 81 and then secured within the recess 82 to the body of the chip holder 81 by bonding or other suitable method. Alternatively, the partition 83 may be integrally formed with the body of the chip holder 81, such as by a plastic molding process, to reduce the number of manufacturing steps required to form the chip holder 81.

When a chip holder 81 contains a plurality of compartments 84 for LED chips 85, it is not necessary for every one of the compartments 84 to contain an LED chip 85, but at most one LED chip 85 is mounted in any one of the compartments 84 in order to keep adjoining LED chips 85 separated from each other by the partitions 83.

Figure 17:
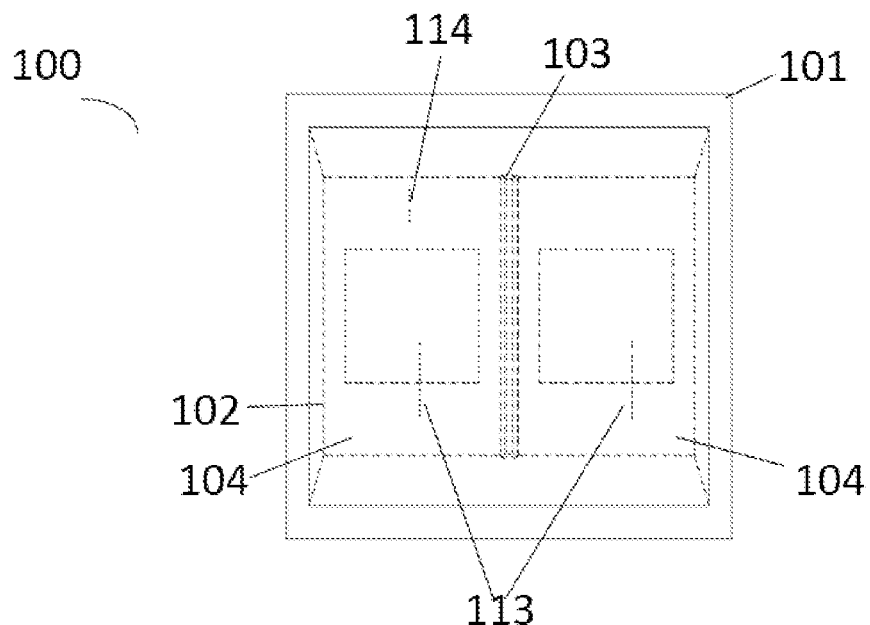
FIG. 17 is a schematic top plan view of an LED module in another embodiment of the present invention.

As shown in FIG. 17, in this embodiment, the two compartments 84 are rectangular as viewed in plan, but they are not limited to any particular shape, and they need not have the same shape or size as each other. For example, as viewed in plan, the compartments 84 could be square, triangular, or have other polygonal shape, or they could have a semicircular or other curved shape.

Although the chip holder 81 in this embodiment houses two LED chips 85, as described below, it is possible to install a larger number of LED chips on a chip holder.

Installing a plurality of LED chips on a single chip holder has a number of advantages, such as the following. (1) For the same overall chip area, a plurality of smaller chips are much cheaper than a single large LED chip. (2) The voltage of a light-emitting module having a plurality of LED chips can be more flexible than for a module having a single LED chip. A typical red LED chip has a voltage of about 2V. Accordingly, the voltage of an LED module containing a single LED chip is around 2V. In contrast, the voltage of an LED module containing a plurality of LED chips can be any multiple of 2V, such as 4V, 6V, 8V, etc.

The structure of this embodiment is otherwise the same as that of the embodiment of FIGS. 10-13, and the LED module 80 can be mounted atop a substrate 11 and covered by a lens plate 30 and filler material 35 in the same manner shown in FIG. 1.

In the present embodiment, the periphery of each compartment 83 is defined by a side wall of the partition 84 and the side wall of the recess 82. However, depending upon the number of compartments formed in a chip holder, some of the compartments may not border on the side wall of the recess, and instead the periphery of one or more of the compartments may be defined entirely by the side walls of the partitions. For example, when a chip holder has five or nine compartments formed by multiple partitions, the periphery of one or more of the compartments may be defined entirely by side walls of the partitions. The same effect can be obtained whether the periphery of a compartment is defined entirely by the sides walls of partitions or by the sides walls of the partitions and the side wall of the recess in the chip holder.

Figure 18:
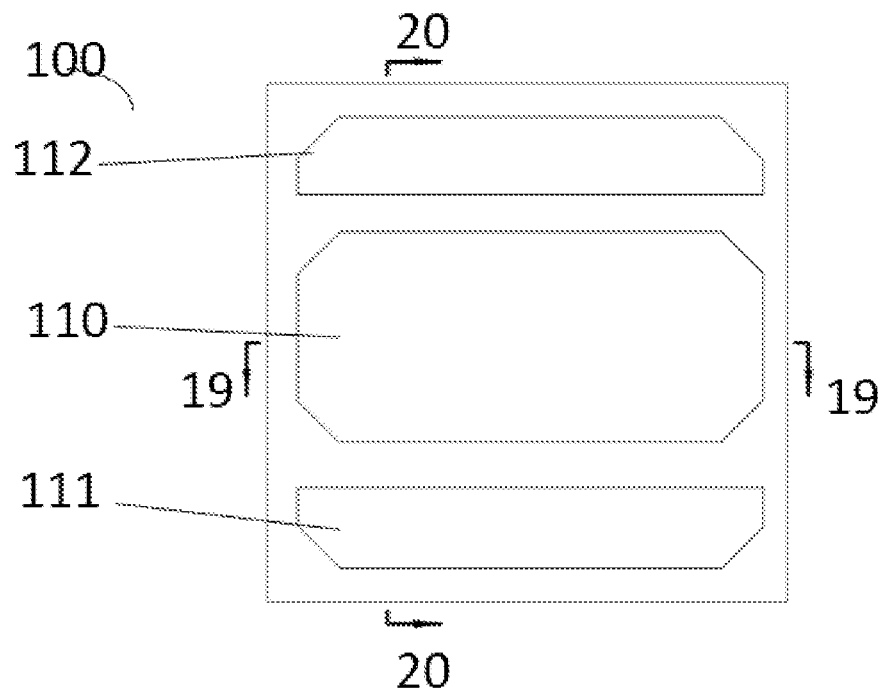
FIG. 18 is a schematic bottom plan view of the LED module of FIG. 17.
Figure 19:
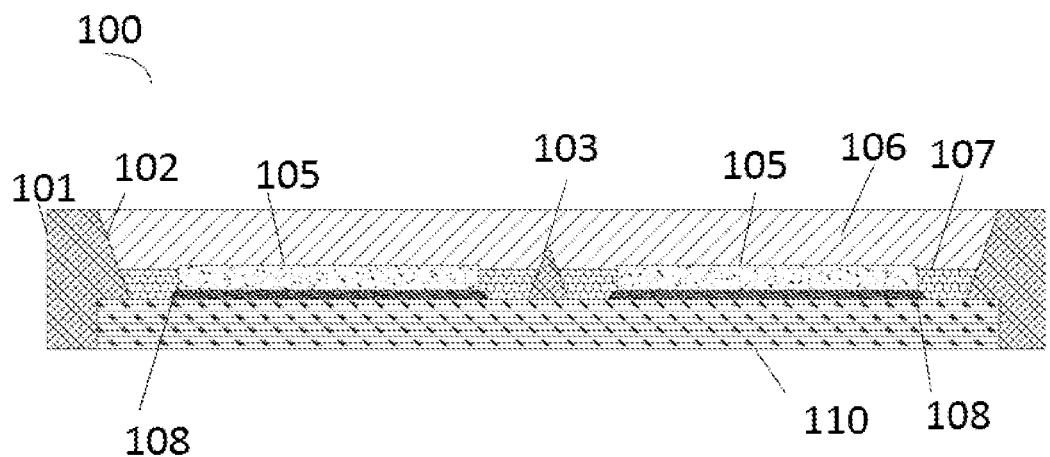
FIG. 19 is a schematic cross-sectional elevation taken along line 19-19 of FIG. 18.
Figure 20:
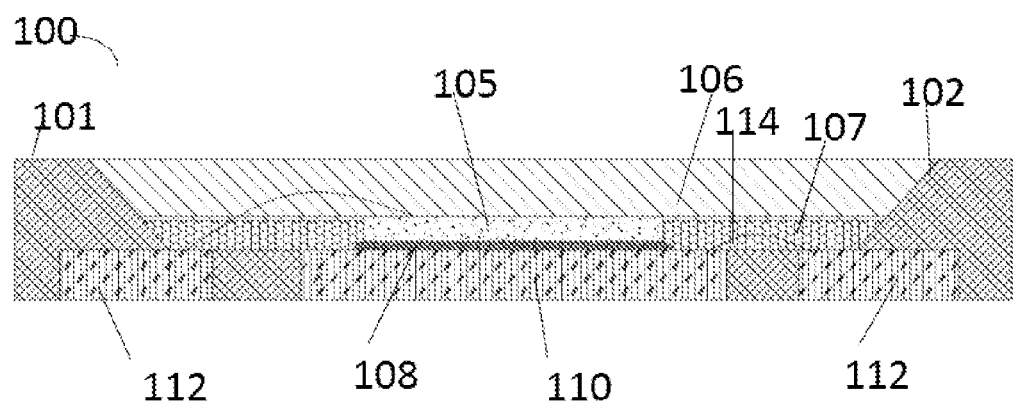
FIG. 20 is a schematic cross-sectional elevation taken along line 20-20 of FIG. 18.

FIGS. 17-20 schematically illustrate an LED module 100 in another embodiment of the present invention. FIG. 17 is a top plan view of the LED module 100, FIG. 18 is a bottom plan view of the LED module 100 of FIG. 17, FIG. 19 is a schematic cross-sectional elevation taken along line 19-19 of FIG. 18, and FIG. 20 is a schematic cross-sectional elevation taken along line 20-20 of FIG. 18.

The overall structure of this embodiment is similar to that of the embodiment of FIGS. 13-16. As in that embodiment, two red LED chips 105 are mounted in the bottom of a recess 102 in individual compartments 104 of a chip holder 101 and are separated from each other by a partition 103. An optically reflective layer 107 is formed on the bottom surface of the recess 102, and each of the LED chips 105 is at least partially embedded in the optically reflective layer 107. In addition, as in the preceding embodiment, the optically reflective layer 107 and the top surfaces of the LED chips 105 are covered by an optical encapsulant 106 having a planar upper surface.

The principal difference between this embodiment and the previous embodiment is the electrical connections to the LED chips 105. Whereas the chip holder 81 of the embodiment shown in FIGS. 13-16 has two conductive metal portions (namely, a positive metal conductive portion 90 and a negative metal conductive portion 91) mounted in the bottom of the chip holder 81, as shown in FIG. 18, the chip holder 101 in this embodiment has three conductive metal portions mounted in the bottom portion of the chip holder 101, namely, a positive conductive metal portion 111, a negative conductive metal portion 112, and a central conductive metal portion 110 disposed between and spaced from the other two conductive metals portions 111 and 112. As shown in FIG. 19, the positive sides of the LED chips 105 (the lower sides in FIG. 19) are secured to and electrically connected to the central conductive metal portion 110 of the chip holder 101 by a die attach adhesive 108 in the same manner as the LED chips 85 are secured to the positive metal conductive portion 90 in the embodiment of FIG. 15. The negative sides of the LED chips 105 (the top sides in FIG. 20) are electrically connected in parallel to the negative metal conductive portion 112 by corresponding wires 113, and the central metal conductive portion 110 is electrically connected to the positive metal conducting portion 111 by a wire 114.

As is the case with respect to the preceding embodiments, it is possible for the upwardly facing sides of the LED chips 105 to be the positive sides and for the downwardly facing sides to be the negative sides of the LED chips 105.

The structure of this embodiment is otherwise the same as that of the previous embodiment, and it can be incorporated into an LED assembly in the manner illustrated in FIG. 1.

Figure 21:
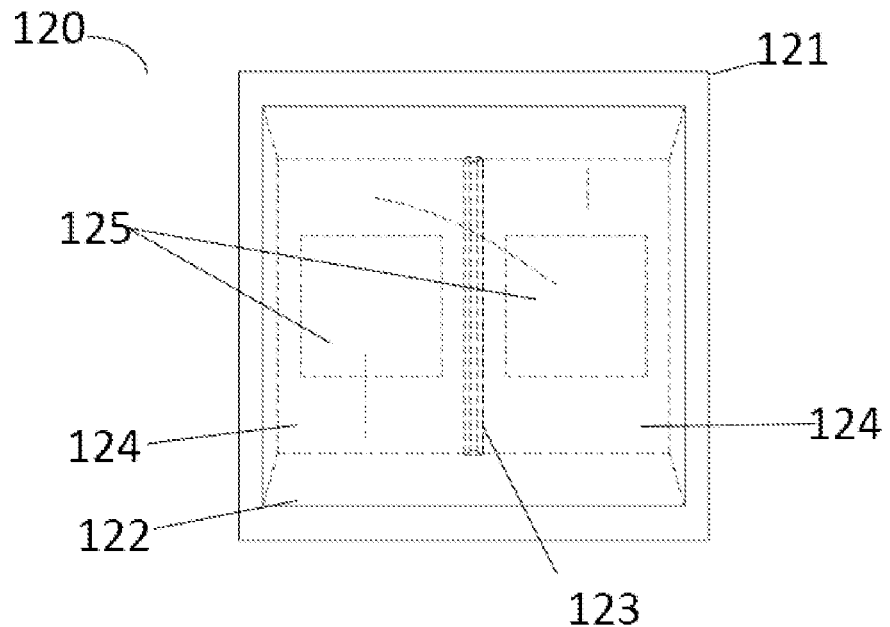
FIG. 21 is a schematic top plan view of an LED module in another embodiment of the present invention.
Figure 22:
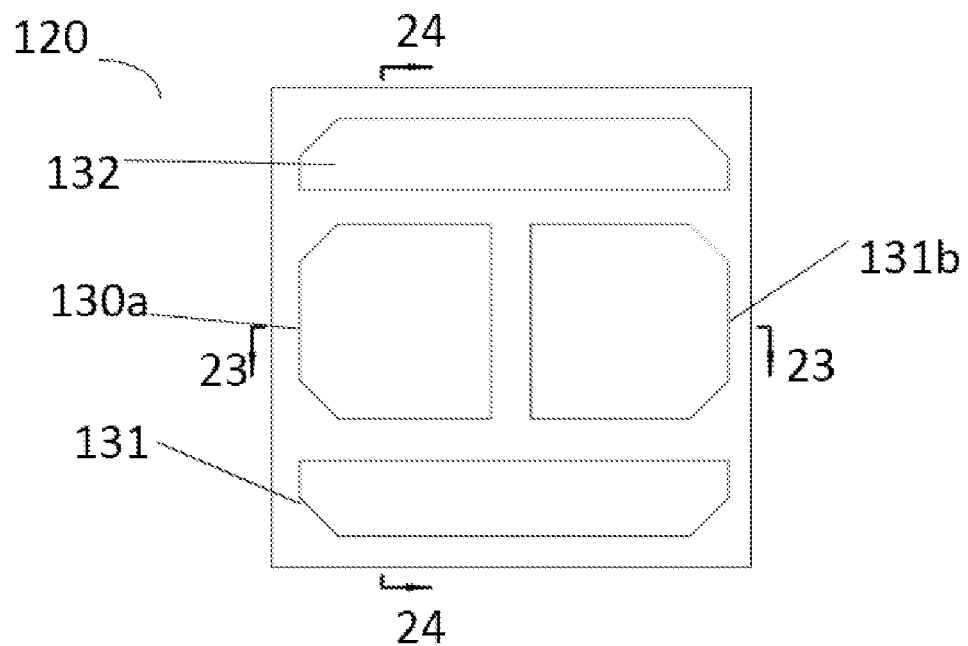
FIG. 22 is a schematic bottom plan view of the LED module of FIG. 21.
Figure 23:
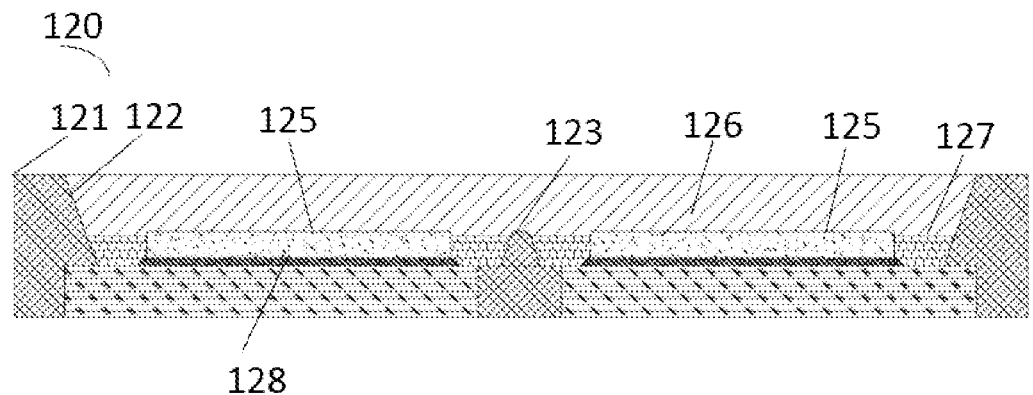
FIG. 23 is a schematic cross-sectional elevation taken along line 23-23 of FIG. 22.
Figure 24:
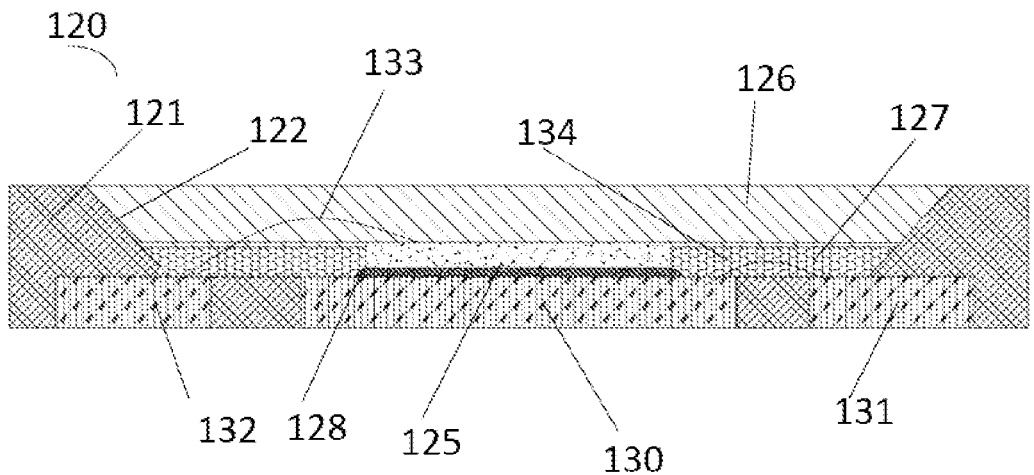
FIG. 24 is a schematic cross-sectional elevation taken along line 24-24 of FIG. 22.

FIGS. 21-24 schematically illustrate an LED module 120 in another embodiment of the present invention. FIG. 21 is a top plan view of the LED module 120, FIG. 22 is a bottom plan view of the LED module 120 of FIG. 21, FIG. 23 is a schematic cross-sectional elevation taken along line 23-23 of FIG. 22, and FIG. 24 is a schematic cross-sectional elevation taken along line 24-24 of FIG. 22.

As in the preceding embodiments, the LED module 120 in this embodiment includes a chip holder 121 having a recess 122 which is divided into two compartments 124 by a partition 123 extending between opposite sides of the recess 122, and a red LED chip 125 is mounted in the bottom of each compartment 124. An optically reflective layer 127 is formed on the bottom surface of the recess 122, and each of the LED chips 125 is at least partially embedded in the optically reflective layer 127. In addition, the optically reflective layer 127 and the top surfaces of the LED chips 125 are covered by an optical encapsulant 126, which preferably has a planar upper surface.

In the embodiments of FIGS. 13 and 17 in which two LED chips (85 and 105) are mounted within a recess in a chip holder, the two LED chips are electrically connected in parallel with each other. However, it is also possible for multiple LED chips in an LED module according to the present invention be connected in series, as is the case in the embodiment shown in FIGS. 21-24. As shown in FIG. 22, a chip holder 121 in this embodiment has a positive metal conductive portion 131, a negative metal conductive portion 132, and two central metal conductive portions 130a and 130b mounted in the bottom portion of the chip holder 121. The two central metal conductive portions 130a and 103bb are separated from each other, and the positive and negative conductive metal portions 131 and 132 are spaced from each other and disposed on opposite sides of the central metal conductive portions 130a and 130b. As shown in FIG. 23, the positive side of each of the LED chips 125 (the lower side in FIG. 23) is secured to and electrically connected to a corresponding one of the central conductive metal portions 130a and 130b of the chip holder 121 by a die attach adhesive 128 in the same manner as the LED chips 105 are secured to the positive metal conductive portion 110 in FIG. 19.

As shown in FIG. 24, the negative conductive metal portion 132 is connected to the negative side (the top side in FIG. 24) of a first one of the LED chips 125 by a wire 133. The central metal conductive portion 130a on which the first LED chip 125 is mounted is electrically connected to the negative side of the second LED chip 125 by another wire (not shown in FIG. 24), and the central metal conductive portion 130b on which the second LED chip 125 is mounted is electrically connected to the positive metal conductive portion 131 by yet another wire 134. In this manner, the two LED chips 125 are electrically connected in series between the positive metal conductive portion 131 and the negative conductive metal portion 132, which are in turn electrically connected to an unillustrated substrate.

As is the case with respect to the preceding embodiments, it is possible for upwardly facing side of the LED chips 125 to be the positive side and for the downwardly facing side to be the negative side of the LED chips 125.

The structure of this embodiment is otherwise the same as that of the previous embodiment, and it can be incorporated into an LED assembly in the manner illustrated in FIG. 1.

Figure 25:
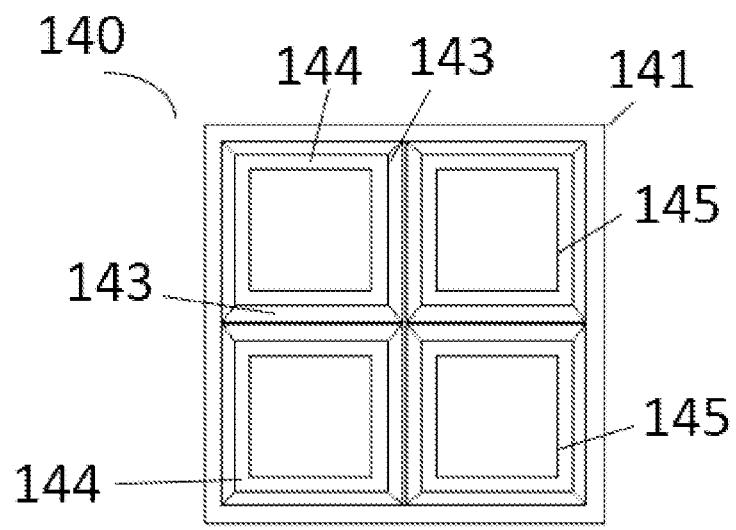
FIG. 25 is a schematic top plan view of an LED module in another embodiment of the present invention.

FIG. 25 is a schematic top plan view of an LED module 140 according to another embodiment of the present invention. Like the previous embodiments, the LED module 140 includes a chip holder 141 having a recess 142 on the bottom surface of which a plurality of red LED chips 145 are mounted. As in the previous embodiments, at least the top surfaces of the LED chips 145 are covered by an optical encapsulant, which has been omitted from FIG. 25 for clarity.

As stated previously, there is no restriction on the number of LED chips installed on a single chip holder, and in this embodiment, four LED chips 145 are installed on the chip holder 141. The chip holder 141 includes two partitions 143 which extend between opposite walls of the recess 142 and intersect each other at right angles. The peripheral walls of the recess 142 and the partitions 143 together divide the interior of the recess 142 into four compartments 144. Each of the compartments 144 in FIG. 25 is square as viewed in plan, but the shape of the compartments 144 is not restricted and can be various other polygonal shapes (such as triangular or rectangular), curved shapes, or a combination of curved and polygonal shapes.

Similarly, while the outer peripheral shape of the recess 142 is square as viewed in plan in FIG. 25, it can have a wide variety of other shapes, such as circular as in the embodiments shown in FIGS. 7 and 10.

The structure of the LED module 140 can be otherwise the same as in any of the preceding embodiments, and this embodiment can be employed in an LED assembly in the manner illustrated in FIG. 1.

As mentioned above, an LED assembly according to the present invention is particularly suitable for use in a lighting fixture, such as a lighting fixture for plants. FIGS. 26-30 schematically illustrate an embodiment of a plant lighting fixture 150 employing an LED assembly according to the present invention. As shown in these figures, the lighting fixture 150 includes an elongated mounting frame 160 on which one or more LED assemblies 151 according to the present invention is mounted. The mounting frame 160 illustrated in FIG. 26 supports three LED assemblies 151 disposed end to end, but the number of LED assemblies 151 mounted on a single mounting frame 160 is not restricted, and, for example, there can be a single LED assembly 151 mounted on the mounting frame 160.

Like the LED assembly 10 illustrated in FIG. 1, each of the LED assemblies 151 in this embodiment includes a substrate (typically a printed circuit board), a plurality of unillustrated LED modules according to the present invention mounted on and electrically connected to the substrate, a lens plate 170 which sits atop the substrate over the LED modules, and an unillustrated filler material disposed atop the LED modules between the substrate and the lens plate 170 to exclude air from between the LED modules and the interior of the lens plate 170.

Figure 30:
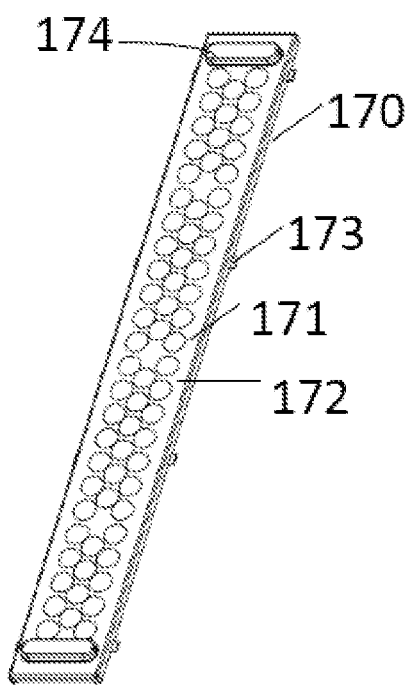
FIG. 30 is a schematic axonometric view of one of the lens plates of the embodiment of FIG. 26.

As shown in FIG. 30, which is an axonometric view of the lens plate 170 of one of the LED assemblies 151, in this embodiment, each of the lens plates 170 is an elongated member having a planar rectangular base 172 and a plurality of lens portions 171 protruding upwards from the top surface of the base 172. In the same manner as shown in FIG. 1, each of the lens portions 171 defines a cavity between the upper surface of the substrate on which the LED modules are mounted and the inner surface of the lens portion 171, and the cavity is filled with a filler material so as to exclude substantially all air from the cavity.

There is no restriction on the number of LED modules in each LED assembly 151. A typical number of LED modules is from 20 to 250 per LED assembly 151, but a smaller or larger number of units can be employed based on the particular application. The individual LED modules can have the same structure as in any of the preceding embodiments of the present invention.

Figure 28:
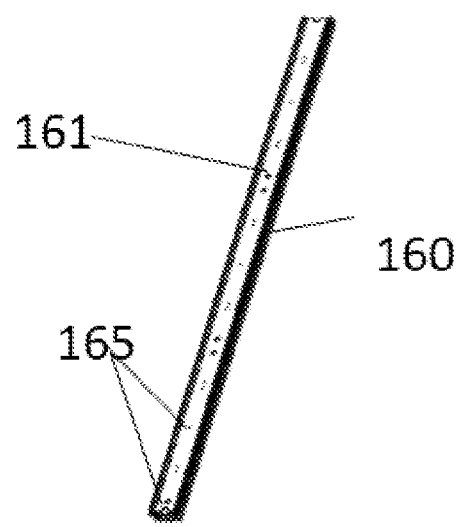
FIG. 28 is an enlarged schematic axonometric view of a portion of the mounting frame of the embodiment of FIG. 26.
Figure 29:
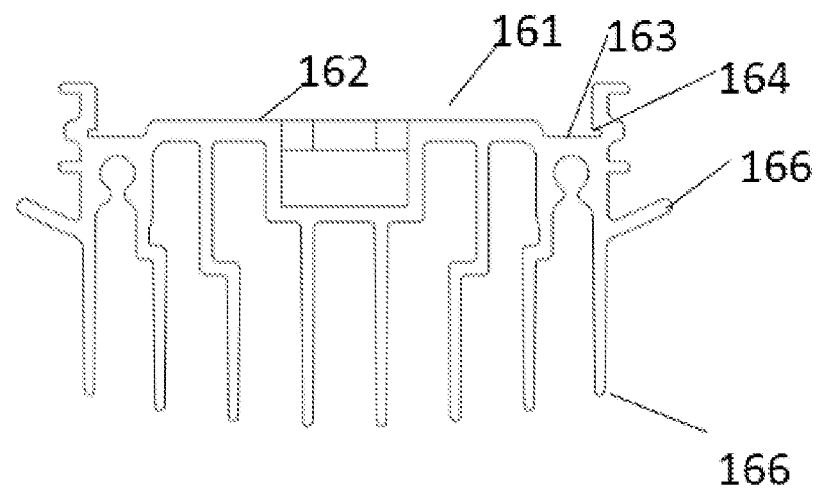
FIG. 29 is a schematic transverse cross-sectional elevation of the mounting frame of FIG. 28.

As shown in FIGS. 28 and 29, the mounting frame 160 in this embodiment is an elongated linear member having an elongated channel 161 having a U-shaped periphery on the top side of the mounting frame 160 and extending in the lengthwise direction of the mounting frame 160 over the entire length of the mounting frame 160. The bottom surface of the channel 161 functions as a generally flat mounting surface 162 for the LED assemblies 151. Each of the LED assemblies 151 rests atop the mounting surface 162, with the substrate of each LED assembly 151 secured to the mounting surface 162 by screws or other suitable attachment methods.

As shown in FIG. 30, in this embodiment, each lens plate 170 has a plurality of protrusions in the form of tabs 173 formed at intervals along both of its lengthwise sides and extending outwards from the lens plate 170 in the widthwise direction of the lens plate 170. Corresponding recesses 163 for engaging with the tabs 173 are formed in the bottom of the channel 161 of the mounting frame 160. The tabs 173 on the lens plates 170 can engage with the recesses 163 in the channel 161 by a snap fit to secure the lens plates 170 within the channel 161.

Figure 27:
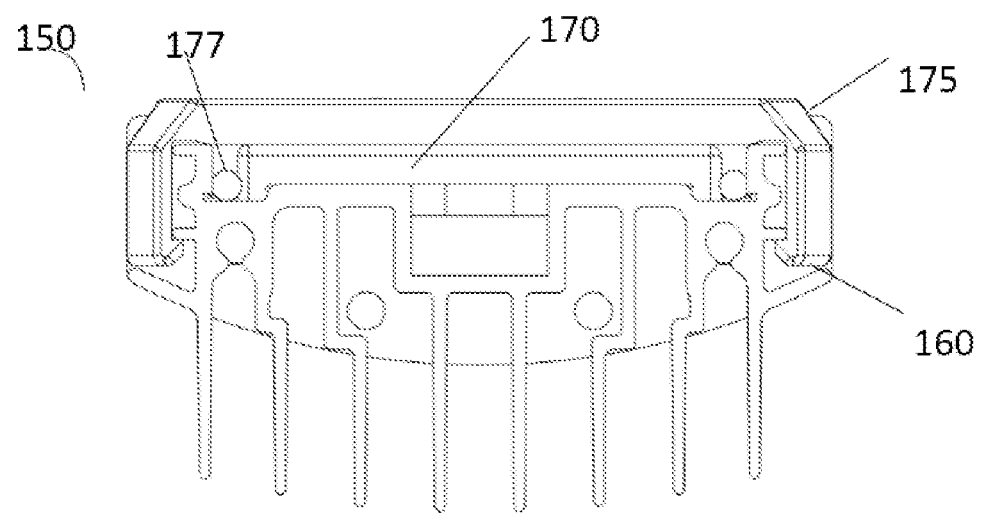
FIG. 27 is a schematic transverse cross-sectional elevation of the embodiment of FIG. 26.

As shown in FIG. 27, a sealing ring 177 may be disposed in the channel 161 of the mounting frame 160 and squeezed between the sides of the lens plate 170 and the inner surface of the channel 161 to provide a sealing effect against moisture and dust. The sealing ring 177 may be coated with a sealant to enhance the sealing effect. As shown in FIG. 29, a positioning groove 164 for positioning the sealing ring 177 may be formed on both widthwise sides of the channel 161 of the mounting frame 160. This arrangement for mounting the lens plates 170 on the mounting frame 160 is simple, convenient, and provides a good sealing effect. However, other methods can be used to mount the lens plates 170 on the mounting frame 160.

Figure 26:
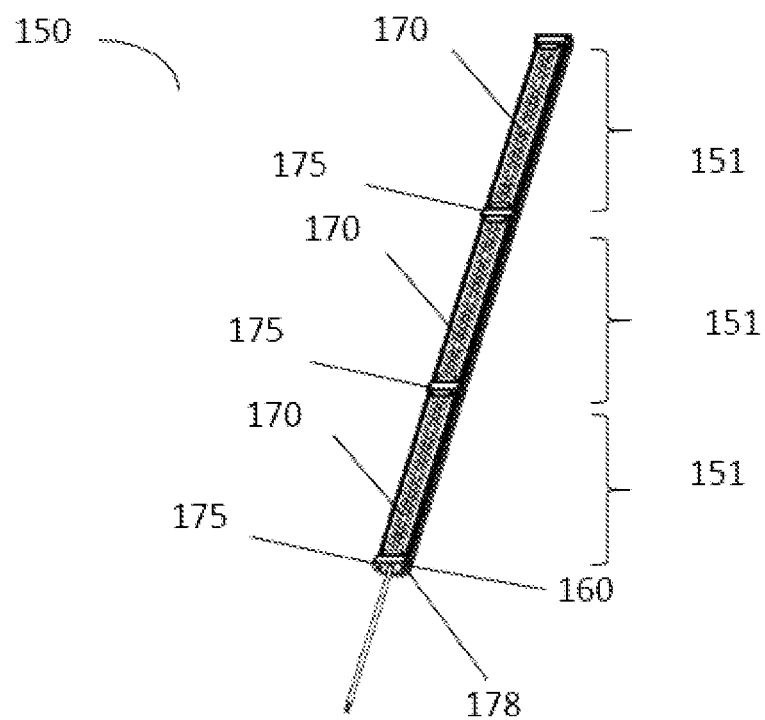
FIG. 26 is a schematic axonometric view of an embodiment of a plant lighting fixture according to the present invention.

As shown in FIG. 26, clamping members 175 may be provided at the lengthwise ends of the lens plates 170 in order to more tightly press the lens plates 170 against the mounting frame 160. As shown in FIG. 27, each of the clamping members 175 in this embodiment engages the mounting frame 160 with a snap fit. As shown in FIG. 26, it is possible for two lens plates 170 which adjoin each other in the lengthwise direction to share a clamping member 175, with the clamping member 175 restraining a lengthwise end of each of the two adjoining lens plates 170. As shown in FIG. 30, stoppers 174 in the form of upward protrusions may be formed on the top surface of the lens plates 170 at the lengthwise ends of the lens plates 170. If a force acts on the lens plates 170 in the lengthwise direction of the lens plate 170, the stoppers 174 will contact the clamping members 175 to resist translation of the lens plates 170 in their lengthwise direction.

As shown in FIG. 28, holes 165 for wiring may be formed in the mounting surface 162 of the mounting frame 160 to facilitate electrical connection between adjacent LED assemblies 151. In addition, as shown in FIG. 26, a cover plate 178 may be provided at each lengthwise end of the mounting frame 160. One of the cover plates 178 may be provided with a through hole through which a power cord or other wiring can enter the lighting fixture 150.

As shown in FIGS. 27 and 29, a heat sink 166 may be formed on or attached to the bottom side of the mounting frame 160 to provide heat dissipation.

An example of a method of assembling the lighting fixture 150 is as follows. A plurality of LED modules according to the present invention are mounted on a substrate such as a printed circuit board, and the substrate is placed on the mounting surface 162 of the mounting frame 160 and secured to the mounting surface 162. The inner surfaces of the lens portions 171 of the lens plate 170 are filled with a filler material or the filler material is placed atop the LED modules, baking is performed, and then the lens plate 170 is mounted atop the substrate. In this manner, the space between the LED modules and the inner surface of the lens portions 171 is filled with the filler material.

As stated above, red light is particularly conducive to promoting the growth of plants, and the above-described embodiments of LED modules according to the present invention employ red LED chips as light emitting elements. However, a plant lighting fixture according to the present invention is not restricted to the use solely of red LED chips, and it is possible for the plant lighting fixture to include light emitting elements which generate other colors of light, such as white light, blue light, infrared light, or ultraviolet light and to combine different colors to obtain spectra suited to the growth of specific plants.

Figure 31:
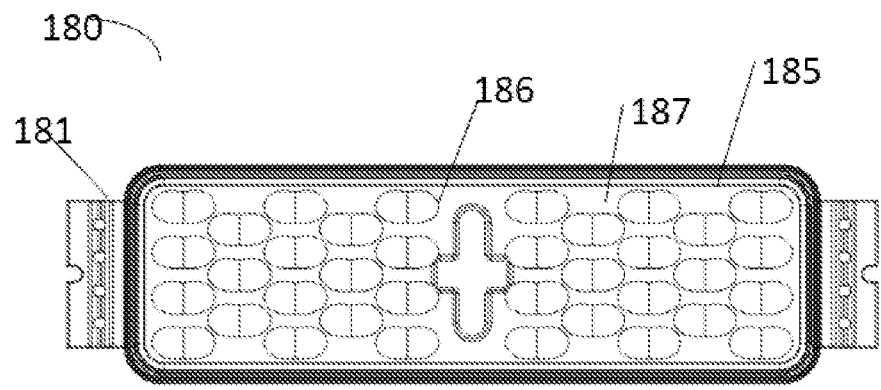
FIG. 31 is a schematic top plan view of another embodiment of a plant lighting fixture according to the present invention.
Figure 32:
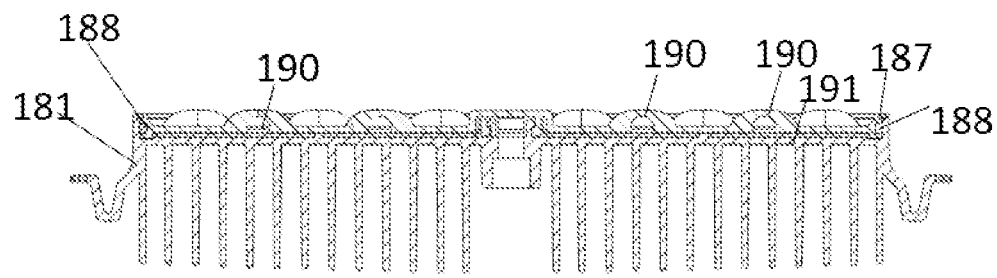
FIG. 32 is a schematic cross-sectional elevation of the embodiment of FIG. 31 taken along line 32-32 of FIG. 31.

FIGS. 31 and 32 schematically illustrate another embodiment of a plant lighting fixture 180 according to the present invention. FIG. 31 is a top plan view of the plant lighting fixture 180, and FIG. 32 is a longitudinal cross-sectional elevation taken along line 32-32 of FIG. 31. The overall structure of this embodiment is similar to that of the previous embodiment, but in this embodiment, the lighting fixture 180 includes only one LED assembly mounted on a mounting frame 181. The mounting frame 181 includes a recess in its upper portion, and the bottom surface of the recess functions as a mounting surface for the LED assembly. The LED assembly includes a substrate 191 on which a plurality of LED modules 190 according to the present invention are mounted, and it further includes a lens plate 185 which is disposed atop the substrate and has a plurality of lens portions 186 which cover the individual LED modules 190, with a filler material filling the space between the LED modules 190 and the inner surface of the lens portions 186 in the same manner as shown in FIG. 1. The LED modules 190, which are illustrated schematically, may have the same structure as any of the above-described embodiments of LED modules according to the present invention. The lens plate 185 has an upturned rim 187 extending around its periphery, and a sealing ring 188 is pressed between the lower surface of the rim 187 and the sides of the recess of the mounting frame 181 to form a seal between the lens plate 185 and the recess. The structure of this embodiment may be otherwise similar to that of the preceding embodiment.

Figure 33:
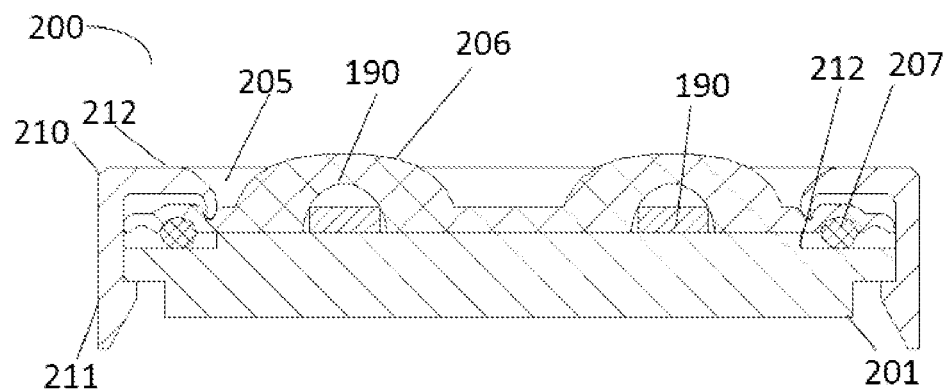
FIG. 33 is a schematic transverse cross-sectional elevation of another embodiment of a plant lighting fixture according to the present invention.

FIG. 33 is a schematic transverse cross-sectional elevation of another embodiment of a plant lighting fixture 200 according to the present invention. A substrate on which are mounted a plurality of LED modules 190 according to the present invention is mounted on the mounting surface of a mounting frame 201, and a lens plate 205 having a plurality of lens portions 206 is disposed atop the substrate with each of the LED modules 190 covered by one of the lens portions 206 of the lens plate 205. A sealing ring 207 is provided between the lens plate 205 and the mounting frame 201 surrounding the LED modules 190. The LED modules 190 are schematically illustrated in FIG. 33 as rectangles, but they may have the same structure as any of the above-described embodiments of LED modules according to the present invention. For simplicity, only two LED modules 190 are shown in FIG. 33, but the number of LED modules 190 mounted on the substrate is in no way limited to two.

This embodiment of a lighting fixture 200 further includes a rim-shaped clamp 210 which extends along the outer periphery of the lens plate 205. The clamp 210 has tabs 211 which engage with the lower surface of the mounting frame 201 with a snap fit. It also has a rim portion 212 which engages with the top surface of the lens plate 205 and presses the lens plate 205 towards the mounting frame 201 and compresses the sealing ring 207 between the lens plate 205 and the mounting frame 201. The structure of this embodiment may be otherwise similar to that of the previous embodiments of a lighting fixture.

What is claimed is:

1. A light emitting diode (LED) assembly comprising:
    a substrate;
    an LED module mounted on the substrate and comprising a chip holder mounted on the substrate, a first red LED chip for emitting red light mounted on the chip holder, and an optical encapsulant having a planar top surface and covering a top surface of the LED chip, wherein the LED module is a plastic leaded chip carrier package;
    a lens plate disposed on the substrate and having at least one lens portion disposed atop the LED module and defining a space between an inner surface of the lens portion and the LED module; and
    a filler material which fills the space between the LED module and the inner surface of the lens portion and has a refractive index which is greater than that of air.

2. An LED assembly as claimed in claim 1 wherein the chip holder has a recess formed in a top surface thereof, and the first LED chip is disposed on a bottom surface of the recess.

3. An LED assembly as claimed in claim 2 including a partition which divides the interior of the recess into two compartments and a second red LED chip for emitting red light mounted on the chip holder in the recess, the first LED chip being disposed in the first compartment and the second LED chip being disposed in the second compartment, the partition having a height measured from the bottom of the recess which is greater than a height of either of the LED chips measured from the bottom surface of the recess.

4. An LED assembly as claimed in claim 3 wherein the partition has side walls which are sloped with respect to the bottom surface of the recess to reflect light emitted by the LED chips in a direction having a component normal to the bottom surface of the recess.

5. An LED assembly as claimed in claim 4 including a reflective coating formed on the side walls of the partition.

6. An LED assembly as claimed in claim 3 wherein an upper end of the partition is lower than the top surface of the optical encapsulant.

7. An LED assembly as claimed in claim 3 wherein the height of the partition measured from the bottom of the recess is less than the height of the side walls of the recess measured from the bottom surface of the recess.

8. An LED assembly as claimed in claim 3 wherein the partition is integrally formed with the recess.

9. An LED assembly as claimed in claim 3 wherein each of the LED chips is separated from side walls of the compartment in which it is disposed by at least 0.3 mm in any direction.

10. An LED assembly as claimed in claim 2 wherein the recess has side walls which are sloped with respect to the bottom surface of the recess to reflect light emitted by the first LED chip in a direction having a component normal to the bottom surface of the recess.

11. An LED assembly as claimed in claim 10 including a reflective coating formed on the side walls of the recess.

12. An LED assembly as claimed in claim 2 including a reflective coating formed on the bottom surface of the recess.

13. An LED assembly as claimed in claim 2 including an optically reflective layer formed on the bottom surface of the recess beneath the optical encapsulant, wherein the first LED chip is at least partially embedded in the optically reflective layer.

14. An LED assembly as claimed in claim 2 including a plurality of partitions which divide the interior of the recess into at least three compartments and at least three red LED chips for emitting red light mounted on the chip holder, each of the LED chips being disposed in a different one of the compartments and being separated from each other by the partitions, each partition having a height measured from the bottom of the recess which is greater than the height of the LED chips measured from the bottom surface of the recess, wherein the optical encapsulant covers the top surface of each of the LED chips.

15. A plant lighting fixture comprising:
a mounting frame; and
at least one LED assembly as claimed in claim 1 mounted on the mounting frame.

16. A plant lighting fixture as claimed in claim 15 wherein the mounting frame has an elongated mounting recess formed therein, and the LED assembly is disposed in the mounting recess.

17. A plant lighting fixture as claimed in claim 16 including a sealing ring disposed in the mounting recess and forming a seal between the lens plate and the mounting recess.

18. A plant lighting fixture as claimed in claim 17 wherein the sealing ring is coated with a sealant.

19. A plant lighting fixture as claimed in claim 16 wherein the lens plate of the LED assembly includes a plurality of projections which engage the mounting recess in the mounting frame with a snap fit.

20. A plant lighting fixture as claimed in claim 15 including a plurality of the LED assemblies arranged end-to-end on the mounting frame.

21. A plant lighting fixture as claimed in claim 15 wherein the mounting frame includes a heat sink.

22. An LED assembly as claimed in claim 1 wherein the filler material has a refractive index which is differs from a refractive index of the optical encapsulant by at most +0.3.

23. An LED assembly as claimed in claim 22 wherein the filler material has a refractive index of 1.3-1.7.

24. An LED assembly as claimed in claim 1 wherein the first LED chip has a vertical package structure.

25. An LED assembly as claimed in claim 1 wherein the first LED chip emits red light with a wavelength of 655-665 nm.

26. An LED assembly as claimed in claim 1 wherein the filler material comprises a silicone gel.

27. An LED assembly as claimed in claim 1 wherein the substrate comprises a printed circuit board.

28. An LED assembly as claimed in claim 1 including a plurality of the LED modules mounted on the substrate, wherein the lens plate includes a plurality of lens portions, each of the LED modules being disposed underneath one of the lens portions, each of the lens portions defining a space between an inner surface of the lens portion and one of the LED modules, each space being filled with the filler material.

29. A method of promoting plant growth comprising irradiating a plant with red light using an LED assembly as claimed in claim 1.

* * * * *